(12) United States Patent
Kato et al.

(10) Patent No.: US 11,411,188 B2
(45) Date of Patent: Aug. 9, 2022

(54) ARYLAMINE POLYMER INCLUDING SILICONE, AND ELECTROLUMINESCENCE DEVICE MATERIAL AND ELECTROLUMINESCENCE DEVICE USING THE POLYMER

(71) Applicant: SAMSUNG ELECTRONICS CO., LTD., Suwon-si (KR)

(72) Inventors: Fumiaki Kato, Yokohama (JP);
Masashi Tsuji, Hwaseong-si (KR);
Takahiro Fujiyama, Yokohama (JP);
Keigo Furuta, Yokohama (JP); Takao Motoyama, Hwaseong-si (KR); Yusaku Konishi, Yokohama (JP)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 166 days.

(21) Appl. No.: 16/729,628

(22) Filed: Dec. 30, 2019

(65) Prior Publication Data
US 2020/0212322 A1  Jul. 2, 2020

(30) Foreign Application Priority Data

Dec. 28, 2018 (JP) .............................. JP2018-248409
Dec. 27, 2019 (KR) ......................... 10-2019-0176496

(51) Int. Cl.
*H01L 51/00* (2006.01)
*C08G 73/02* (2006.01)
(Continued)

(52) U.S. Cl.
CPC ...... *H01L 51/0094* (2013.01); *C08G 73/0246* (2013.01); *C09D 5/24* (2013.01);
(Continued)

(58) Field of Classification Search
CPC ............ H01L 51/0094; H01L 51/0039; H01L 51/0035; H01L 51/0043; H01L 51/5056;
(Continued)

(56) References Cited

U.S. PATENT DOCUMENTS 8,330,142 B2   12/2012  Cho et al.
2016/0285000 A1*  9/2016  Radu ................... H01L 51/0059

FOREIGN PATENT DOCUMENTS

JP         2010199067 A      9/2010

OTHER PUBLICATIONS

Chang et al. (Scientific Reports 6, Article No. 38404, 2016, p. 1095-1118).*

* cited by examiner

*Primary Examiner* — Shane Fang
(74) *Attorney, Agent, or Firm* — Cantor Colburn LLP

(57) ABSTRACT

An electroluminescent device with an improved luminous efficiency. The device includes a light emitting layer with an arylamine polymer including a structural unit (A) represented by Chemical Formula (1).

(Continued)

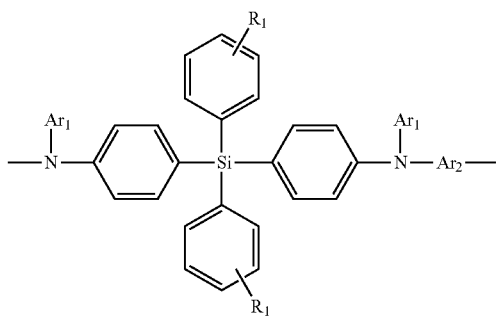
(51) Int. Cl.
C09D 179/02 (2006.01)
C09D 5/24 (2006.01)
H01L 51/50 (2006.01)
(52) U.S. Cl.
CPC ........ *C09D 179/02* (2013.01); *H01L 51/0035* (2013.01); *H01L 51/0043* (2013.01); *H01L 51/5056* (2013.01); *H01L 51/5088* (2013.01)
(58) Field of Classification Search
CPC ........ H01L 51/5088; C08G 2261/3162; C08G 2261/76; C08G 2261/95; C08G 73/0246; C08L 79/02; C09D 5/24; C09D 179/02
USPC .......................................................... 428/690
See application file for complete search history.
14 Claims, 1 Drawing Sheet

ARYLAMINE POLYMER INCLUDING SILICONE, AND ELECTROLUMINESCENCE DEVICE MATERIAL AND ELECTROLUMINESCENCE DEVICE USING THE POLYMER

CROSS-REFERENCE TO RELATED APPLICATION

This application claims priority to Japanese Patent Application No. 2018-248409 filed in the Japan Patent Office on Dec. 28, 2018, and Korean Patent Application No. 10-2019-0176496 filed in the Korean Intellectual Property Office on Dec. 27, 2019, and all the benefits accruing therefrom under 35 U.S.C. § 119, the entire content of which is herein incorporated by reference.

BACKGROUND

1. Field

An arylamine polymer including silicon and an electroluminescence device material and an electroluminescence device using the polymer are disclosed.

2. Description of the Related Art

Research and development of electroluminescence devices (EL devices) are actively progressing. In particular, EL devices are expected to be used as solid-light emitting type inexpensive and large area full color display devices or recording light source arrays. An EL device is a light emitting device including a thin film of several nanometers to several hundred nanometers of organic materials between an anode and a cathode. In addition, the EL devices usually further include a hole transport layer, a light emitting layer, an electron transport layer, or the like.

Among these, the light emitting layer includes a fluorescent light emitting material and a phosphorescent light emitting material. The phosphorescent light emitting material is a material which is expected to have luminous efficiency of about four times that of the fluorescent light emitting material. In addition, since it covers a wide color gamut, a RGB light source requires a light emitting spectrum having a narrow half value width. Although deep blue is particularly required for blue, there are currently no devices found to be long-span and satisfy the viewpoint of color purity.

As a method of solving such a problem, there is a light emitting device using "quantum dot" which is an inorganic light emitting material as a light emitting material (See, Patent Document 1, Japanese Patent Laid-Open Publication No. 2 010-199067). Quantum dots are semiconductor materials having crystal structures of several nanometers in size and are made up of hundreds to thousands of atoms. Because quantum dots are very small in size, a surface area per unit volume is large. For this reason, most of the atoms are present on the surface of the nanocrystals, and exhibit quantum confinement effects. Due to the quantum confinement effect, a quantum dot is able to adjust the light emitting wavelength by adjusting its size, and has a lot of attention because it has characteristics such as improved color purity and high photoluminescence (PL) luminous efficiency. A quantum dot electroluminescence device (QLED) is a three-layered device including a hole transport layer (HTL), an electron transport layer (ETL), and a quantum dot light emitting layer disposed between the HTL and the ETL.

SUMMARY

Conventional organic electroluminescence light emitting diodes (OLEDs) include a hole transport layer and a light emitting layer. The highest occupied molecular orbital (HOMO) level of the material used for the hole transport layer (HTL) is between 5.0 electron volts (eV) and 5.3 eV. In addition, since the HOMO level of the material used in the light emitting layer is between 5.0 eV to 5.5 eV, a difference between the HOMO levels with the material used for the hole transport layer (HTL) is small, which enables efficient hole transport and thus provides high efficiency devices.

Meanwhile, a valance band level of the quantum dot used for QLED is about 6.8 eV. As a result, there is a large difference of a band offset from the HOMO level of the hole transport layer material used in the conventional organic electroluminescence light emitting diode (OLED), which may cause problems such as deterioration of a turn-on voltage and a driving voltage, efficiency, or carrier injection efficiency of the QLED. In order to solve these problems, we sought to adjust the HOMO level of the hole transport layer, or decrease the band offset with the QD (Quantum Dot) layer, by using an appropriate hole transport layer material. Unfortunately, designing or developing a hole transporting material with HOMO levels of greater than or equal to about 5.4 eV remains a technical challenge, particularly, a material that demonstrates structural stability over the lifetime of an electroluminescent device.

The present invention has been made in view of the above circumstances, and there is a demand for a material that may be used in a hole transport layer of a quantum dot electroluminescence device. In addition, in light of recent competition for development of light emitting devices, a light emitting device having a higher luminous efficiency is required.

To provide a technology capable of improving luminous efficiency of an electroluminescence device (even a partially quantum dot electroluminescence device) the inventors have conducted a thorough study to solve the above technical challenges by developing and identifying a polymer having a specific structure, and in particular, for developing new materials for hole transport or hole injection.

That is, an arylamine polymer including silicon and having a structural unit (A) represented by Chemical Formula (1) is provided:

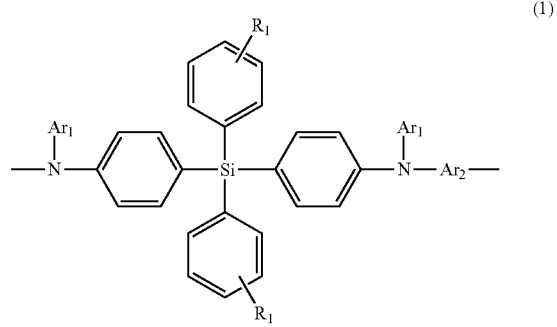

(1)

wherein in Chemical Formula (1), $Ar_1$ is independently a C6 to C25 aromatic hydrocarbon group which may be optionally substituted, or a C12 to C25 heterocyclic aromatic group which may be optionally substituted;

Ar$_2$ is a C6 to C25 divalent aromatic hydrocarbon group which may be optionally substituted, or a C12 to C25 divalent heterocyclic aromatic group which may be optionally substituted; and R$_1$ is independently a hydrogen atom, a C1 to C12 linear, branched, or cyclic hydrocarbon group, or a C6 to C25 aromatic hydrocarbon group, each of which may be optionally substituted.

DETAILED DESCRIPTION

Figure 1:
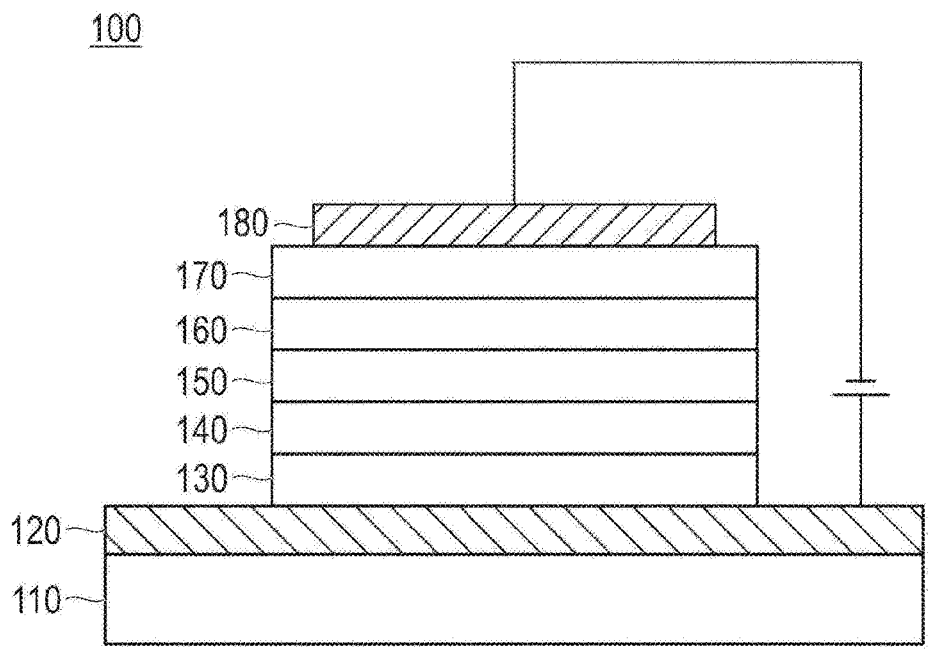
FIG. 1 is a schematic view showing an organic electroluminescence device according to the present embodiment.

In a first embodiment, the present disclosure provides an arylamine polymer including a structural unit (A) represented by Chemical Formula (1):

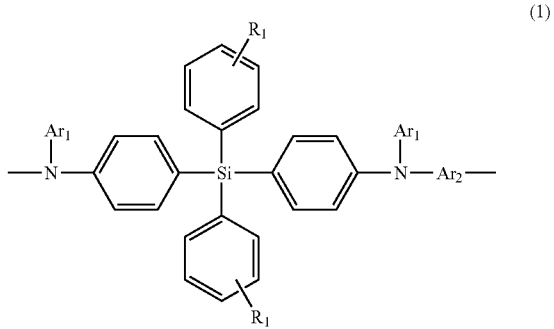

In Chemical Formula (1), Ar$_1$ is independently a C6 to C25 aromatic hydrocarbon group which may be optionally substituted, or a C12 to C25 heterocyclic aromatic group which may be optionally substituted;

Ar$_2$ is a C6 to C25 divalent aromatic hydrocarbon group which may be optionally substituted, or a C12 to C25 divalent heterocyclic aromatic group which may be optionally substituted;

R$_1$ is independently a hydrogen atom, a C1 to C12 linear, branched, or cyclic hydrocarbon group, or a C6 to C25 aromatic hydrocarbon group, each of which may be optionally substituted. In the present specification, the structural unit (A) represented by Chemical Formula (1) may be simply referred to as "structural unit (A)". In addition, the arylamine polymer including silicon and having a structural unit (A) represented by Chemical Formula (1) is also referred to simply as "an arylamine polymer including silicon".

In a second embodiment, the present disclosure provides an electroluminescence device material including the arylamine polymer including silicon.

In a third embodiment, the present disclosure provides an electroluminescence device including a first electrode and a second electrode, and at least one organic film disposed between the first electrode and the second electrode, wherein at least one of the organic films includes the arylamine polymer including silicon. In this specification, the electroluminescence device is also referred to "LED". The quantum dot electroluminescence device is also referred to "QLED."

An organic electroluminescence device is also referred to "OLED."

As a material constituting the light emitting layer or the carrier transport layer of the electroluminescence device, various low molecular materials or polymer materials are used. Among these, the low molecular materials are good in terms of efficiency and life-span of the device. However, when using low molecular materials, the manufacturing cost is relatively high. On the other hand, TFB etc. are known as a hole transporting material as polymer materials (for example, paragraph (0037) of patent document 1). However, such a polymer material does not necessarily have sufficient luminous efficiency or low driving voltage (see Comparative Example 1 below). For this reason, development of a polymer material that may improve luminous efficiency and reduce a driving voltage is required. The inventors have investigated whether polymer materials with an increase of the triplet energy level can be used to improve current efficiency and luminous efficiency. As a result, by applying the polymer having the structural unit (A) of the Chemical Formula (1) to the electroluminescence device, luminous efficiency may be improved and a low driving voltage may be achieved compared with the case of using a known material, for example, in a hole transport layer or in a hole injection layer. A possible mechanism for achieving the effect desired by the configuration of the present disclosure is as follows. In the structural unit (A) of the Chemical Formula (1), a silicon atom cleaves the conjugated main chain. As a result, it is possible to increase the triplet energy level of the polymer compound and achieve high current efficiency. Therefore, by using the polymer compound having a structural unit (A), it is possible to manufacture an electroluminescence device exhibiting high luminous efficiency.

In the structural unit (A) of the Chemical Formula (1), the main chain is cleaved by the silicon atom. For this reason, even when polymerized, the arylamine polymer including silicon exhibits properties of low molecular compounds having similar energy levels to quantum dots. Therefore, the arylamine polymer including silicon may lower the driving voltage.

The arylamine polymer including silicon has a high triplet energy level and may achieve high current efficiency. Therefore, an electroluminescence device fabricated using the arylamine polymer including silicon may exhibit high luminous efficiency. In addition, the arylamine polymer including silicon may suppress an increase in a driving voltage. Accordingly, electroluminescence devices fabricated using the arylamine polymer including silicon may exhibit high luminous efficiency with a low driving voltage. In addition, since the arylamine polymer including silicon has improved film formability and solvent solubility, film formation in a wet (coating) method is possible. Therefore, by using the arylamine polymer including silicon, an area of the electroluminescence device may be improved and high productivity may be realized. The above effects may be effectively exerted when the arylamine polymer including silicon is applied to a hole transport layer or a hole injection layer of an EL device, particularly QLED.

The above mechanism is speculative, and the present disclosure is independent of the mechanism.

Hereinafter, embodiments of the present disclosure are described. The present disclosure is not limited only to the following embodiments. In addition, each drawing is exaggerated for better understanding and ease of description, and a dimensional ratio of each constituent element in each drawing may be different from the actual one. In addition, when the embodiment of the present disclosure has been described with reference to the drawings, the same reference numerals are given to the same elements in the description of the drawings, and redundant descriptions are omitted. Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features.

It will be understood that when an element is referred to as being "on" another element, it can be directly on the other element or intervening elements may be present therebetween. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, unless specifically stated, operations and measurement of properties are carried out under conditions of room temperature (greater than or equal to about 20° C. and less than or equal to about 25° C.)/relative humidity (RH) of greater than or equal to about 40% RH and less than or equal to about 50% RH.

Arylamine Polymer Including Silicon

The arylamine polymer including silicon has a structural unit (A) represented by Chemical Formula (1). The arylamine polymer including silicon having such a structural unit (A) has a high triplet energy level and may improve current efficiency. In addition, a low driving voltage may be achieved. The arylamine polymer including silicon may include one type of structural unit (A), or two or more types of structural units (A).

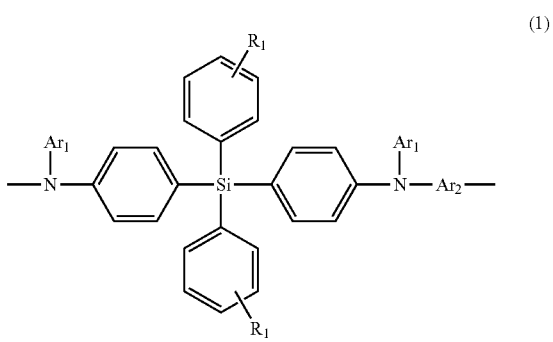

In Chemical Formula (1), $Ar_1$ is independently a C6 to C25 aromatic hydrocarbon group which may be optionally substituted, or a C12 to C25 heterocyclic aromatic group which may be optionally substituted. Herein, examples of the C6 to C25 aromatic hydrocarbon group may include, for example, a monovalent group derived from aromatic hydrocarbon such as benzene (phenyl group), pentane, indene, naphthalene, anthracene, azulene, heptalene, acenaphthene, phenalene, fluorene, anthraquinoline, phenanthrene, biphenyl, terphenyl, tetraphenyl, pentaphenyl, hexaphenyl, pyrene, 9,9-diphenylfluorene, 9,9'-spirobi[fluorene], 9,9-dialkylfluorene, or the like. In addition, examples of the C12 to C25 heterocyclic aromatic group include, but are not limited to, for example, a monovalent group derived a heterocyclic aromatic compound such as acridine, phenazine, benzoquinoline, benzisoquinoline, phenanthridine, phenanthroline, anthraquinone, fluorenone, dibenzofuran, dibenzothiophene, carbazole, imidazo-phenanthridine, benzimidazo-phenanthridine, aza-dibenzofuran, 9-phenylcarbazole, aza-carbazole, aza-dibenzothiophene, diaza-dibenzofuran, diaza-carbazole, diaza-dibenzothiophene, xanthone, dioxanthone, pyridine, quinoline, anthraquinoline, or the like. Of these, at least one $Ar_1$ is desirably a monovalent group derived from a compound of benzene, fluorene, biphenyl, p-terphenyl, 9,9-diphenylfluorene, 9,9'-spirobi[fluorene], dibenzofuran, dibenzothiophene, or 9-phenylcarbazole. More desirably, both $Ar_1$'s are desirably monovalent groups derived from compounds of benzene, fluorene, biphenyl, p-terphenyl, 9,9-diphenylfluorene, 9,9'-spirobi[fluorene], dibenzofuran, dibenzothiophene, or 9-phenylcarbazole. In particular, both $Ar_1$'s are desirably biphenyl. With such $Ar_1$, higher triplet energy level, lower driving voltage, and higher efficiency may be achieved. In the preferred embodiment described above, $Ar_1$ may be unsubstituted or any one hydrogen atom of $Ar_1$ may be replaced by a substituent.

Herein, when any one or more hydrogen atoms of $Ar_1$ is replaced, the number of the substituent is not particularly limited, but may be for example, desirably 1 to 3, more desirably 1 or 2, and particularly desirably 1. In the case where $Ar_1$ has a substituent, the binding position of the substituent is not particularly limited. The substituent is desirably positioned as far (distant) as possible from the nitrogen atom of the main chain to which $Ar_1$ links. By having a substituent in such a position, it is possible to achieve a higher triplet energy level, a lower driving voltage, and higher efficiency.

In addition, when any one of the hydrogen atoms of $Ar_1$ is replaced, the substituent is not particularly limited, but may include an alkyl group, a cycloalkyl group, a hydroxyalkyl group, an alkoxyalkyl group, an alkoxyl group, a cycloalkoxyl group, an alkenyl group, an alkynyl group, an amino group, an aryl group, an aryloxy group, an alkylthio group, a cycloalkylthio group, an arylthio group, an alkoxycarbonyl group, an aryloxycarbonyl group, a hydroxyl group (—OH), a carboxyl group (—COOH), a thiol group (—SH), a cyano group (—CN), or the like. In the above, they are not substituted with the same substituent. That is, the alkyl group as the substituent is not substituted by the alkyl group.

Herein, the alkyl group may be either linear or branched, but desirably includes a C1 to C18 linear or branched alkyl group. Specifically, it may be a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl (2-methylpentyl) group, a 1,2-dimethylbutyl group, an n-heptyl group, a 1,4-dimethylpentyl group, a 3-ethylpentyl group, a 2-methyl-1-isopropylpropyl (2,4-dimethylpentyl) group, a 1-ethyl-3-methylbutyl group, an n-octyl group, a 2-ethylhexyl group, a 3-methyl-1-isopropylbutyl (2,5-dimethylhexyl) group, a 2-methyl-1-isopropylbutyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, or the like.

Examples of the cycloalkyl group include for example, a cyclopropyl group, a cyclobutyl group, a cyclopentyl group, or a cyclohexyl group.

As the hydroxyalkyl group, for example, the alkyl group may be substituted with 1 to 3 (desirably 1 or 2, and particularly desirably 1) hydroxy groups (for example, hydroxymethyl group, hydroxyethyl group).

As the alkoxyalkyl group, for example, the alkyl group may be substituted with 1 to 3 (desirably 1 or 2 and particularly desirably 1) alkoxy groups.

The alkoxy group may be, for example, a methoxy group, an ethoxy group, a propoxy group, an isopropoxy group, a butoxy group, a pentyloxy group, a hexyloxy group, a heptyloxy group, an octyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyloxy group, a 3-ethylpentyloxy group, or the like.

The cycloalkoxy group may include, for example, a cyclopropoxy group, a cyclobutoxy group, a cyclopentyloxy group, a cyclohexyloxy group, or the like.

The alkenyl group may include, for example, a vinyl group, an allyl group, a 1-propenyl group, an isopropenyl group, a 1-butenyl group, a 2-butenyl group, a 3-butenyl group, a 1-pentenyl group, a 2-pentenyl group, a 3-pentenyl group, a 1-hexenyl group, a 2-hexenyl group, a 3-hexenyl group, a 1-heptenyl group, a 2-heptenyl group, a 5-heptenyl group, a 1-octenyl group, a 3-octenyl group, a 5-octenyl group, or the like.

The alkynyl group may include, for example, an acetylenyl group, a 1-propynyl group, a 2-propynyl group, a 1-butynyl group, a 2-butynyl group, a 3-butynyl group, a 1-pentynyl group, a 2-pentynyl group, a 3-pentynyl group, a 1-hexynyl group, a 2-hexynyl group, a 3-hexynyl group, a 1-heptynyl group, a 2-heptynyl group, a 5-heptynyl group, a 1-octynyl group, a 3-octynyl group, a 5-octynyl group, or the like.

The aryl group may include, for example, a phenyl group, a naphthyl group, a biphenyl group, a fluorenyl group, an anthryl group, a pyrenyl group, an azulenyl group, an acenaphthylenyl group, a terphenyl group, or a phenanthryl group.

The aryloxy group may include, for example, a phenoxy group, or a naphthyloxy group.

The alkylthio group may include, for example, a methylthio group, an ethylthio group, a propylthio group, a pentylthio group, a hexylthio group, an octylthio group, a dodecylthio group, or the like.

The cycloalkylthio group may include, for example, a cyclopentylthio group or a cyclohexylthio group.

The arylthio group may include, for example, a phenylthio group, a naphthylthio group, or the like.

The alkoxycarbonyl group may include, for example, a methyloxy carbonyl group, an ethyloxy carbonyl group, a butyloxy carbonyl group, an octyloxy carbonyl group, a dodecyloxycarbonyl group, or the like.

The aryloxycarbonyl group may include, for example, a phenyloxycarbonyl group, a naphthyloxycarbonyl group, or the like.

In a desirable embodiment, $Ar_1$ is independently a group of the following groups. In the following structures, $R_{111}$ to $R_{133}$ are independently a hydrogen atom, a C1 to C12 linear or branched alkyl group which may be optionally substituted, or a C6 to C25 aromatic hydrocarbon group which may be optionally substituted. Herein, the C1 to C12 linear or branched alkyl group may be, for example, a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 2-methylpentyl group, a 1,2-dimethylbutyl group, an n-heptyl group, a 1,4-dimethylpentyl group, a 3-ethylpentyl group, a 2,4-dimethylpentyl group, a 1-ethyl-3-methylbutyl group, an n-octyl group, a 2-ethylhexyl group, a 2,3-dimethylhexyl group, a 2-methyl-1-isopropyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, or the like. In addition, the C6 to C25 aromatic hydrocarbon group may include, for example, the same examples as defined in $Ar_1$, but is not particularly limited thereto. In terms of higher triplet energy levels and lower driving voltages, $R_{111}$ to $R_{133}$ are desirably a hydrogen atom or a linear or branched C2 to C10 alkyl group. More desirably, $R_{111}$ to $R_{133}$ are hydrogen or a C3 to C6 linear alkyl group.

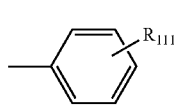 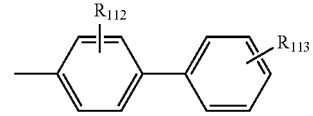

-continued

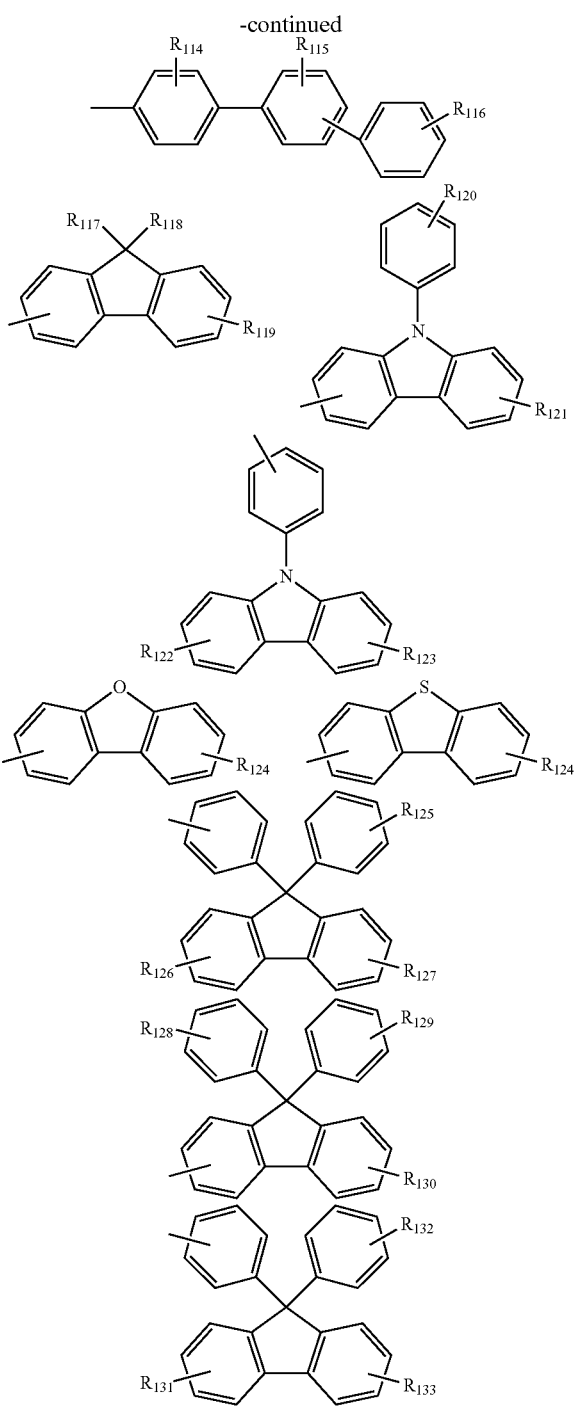

In Chemical Formula (1), $Ar_2$ indicates a C6 to C25 divalent aromatic hydrocarbon group which may be optionally substituted or a C12 to C25 divalent heterocyclic aromatic group which may be optionally substituted. Herein, the C6 to C25 divalent aromatic hydrocarbon group may include, for example, a divalent group derived from C6 to C25 aromatic hydrocarbon defined in $Ar_1$, but is not particularly limited thereto. Similarly, the C12 to C25 divalent heterocyclic aromatic group may include, for example, a divalent group derived from the C12 to C25 heterocyclic aromatic compound defined in $Ar_1$, but is not particularly limited thereto. Of these, $Ar_2$ is desirably a divalent group derived from a compound of benzene, biphenyl, terphenyl, tetraphenyl, pentaphenyl, hexaphenyl, fluorene, 9-phenyl-carbazole, dibenzofuran, dibenzothiophene, 9,9-diphenylfluorene, or 9,9'-spirobi[fluorene]. More desirably, $Ar_2$ is desirably a divalent group derived from a compound of phenyl, biphenyl, terphenyl, tetraphenyl, pentaphenyl, or fluorene. In particular, $Ar_2$ is desirably a divalent group derived from a compound of biphenyl, p-terphenyl, p-tetraphenyl, or p-pentaphenyl. $Ar_2$ is desirably a divalent group derived from p-quinquephenyl. Such $Ar_2$ may achieve a higher triplet energy level, a lower driving voltage, and higher efficiency. In the desirable form described above, $Ar_2$ may be unsubstituted or any one hydrogen atom of $Ar_2$ may be replaced by a substituent.

Herein, when any one or more hydrogen atoms of $Ar_2$ is replaced, the number of the substituents is not particularly limited, but may be for example, desirably 1 to 3, more desirably 1 or 2, and particularly 2, in the case where $Ar_2$ has a substituent, the binding position of the substituent is not particularly limited. For example, in the case of a plurality of substituents, the substituents are desirably in the same aromatic ring or heterocycle, more desirably in the same aromatic ring, and particularly desirably in the same phenyl ring. For example, when two substituents are present in the p-phenylene group, the two substituents may be present at any of positions 2 and 3, positions 2 and 5, and positions 3 and 5, but desirably at positions 2 and 5, and positions 3 and 5, and particularly desirably at positions 3 and 5. In the case where a plurality of substituents are present in a plurality of aromatic rings or heterocycles linked to each other, the substituents desirably exist in an aromatic ring or heterocycle near the center. By having the substituent in such a position, it is possible to achieve a higher triplet energy level, a lower driving voltage, and higher efficiency.

In addition, when any one of the hydrogen atoms of $Ar_2$ is replaced, the substituent is not particularly limited, but may include the same examples as $Ar_1$.

That is, in the desirable form, $Ar_2$ is a divalent group of the following groups. In the following structures, $R_{211}$ to $R_{269}$ are independently a hydrogen atom, a C1 to C12 linear or branched alkyl group which may be optionally substituted, or a C6 to C25 aromatic hydrocarbon group which may be optionally substituted. Herein, the C1 to C12 linear or branched alkyl group, or the C6 to C25 aromatic hydrocarbon group, each of which may be optionally substituted is not particularly limited, but may include the same examples as $R_{111}$ to $R_{133}$. In terms of higher triplet energy levels and lower driving voltages, $R_{211}$ to $R_{269}$ are desirably a hydrogen atom or a linear or branched C2 to C10 alkyl group. More desirably, $R_{211}$ to $R_{269}$ are hydrogen or a C3 to C6 linear alkyl group.

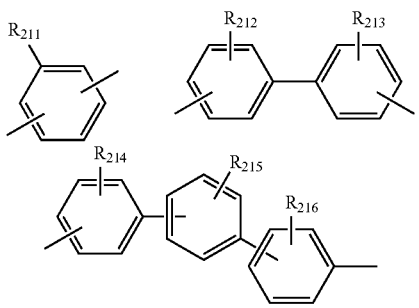

-continued
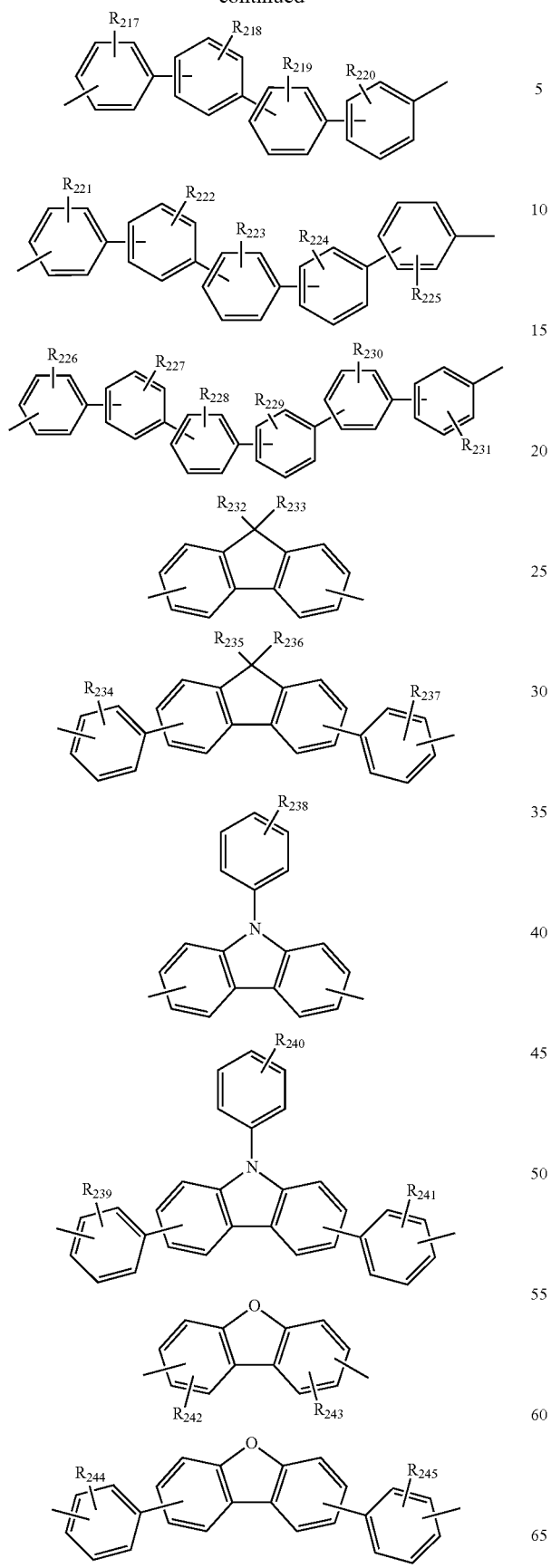
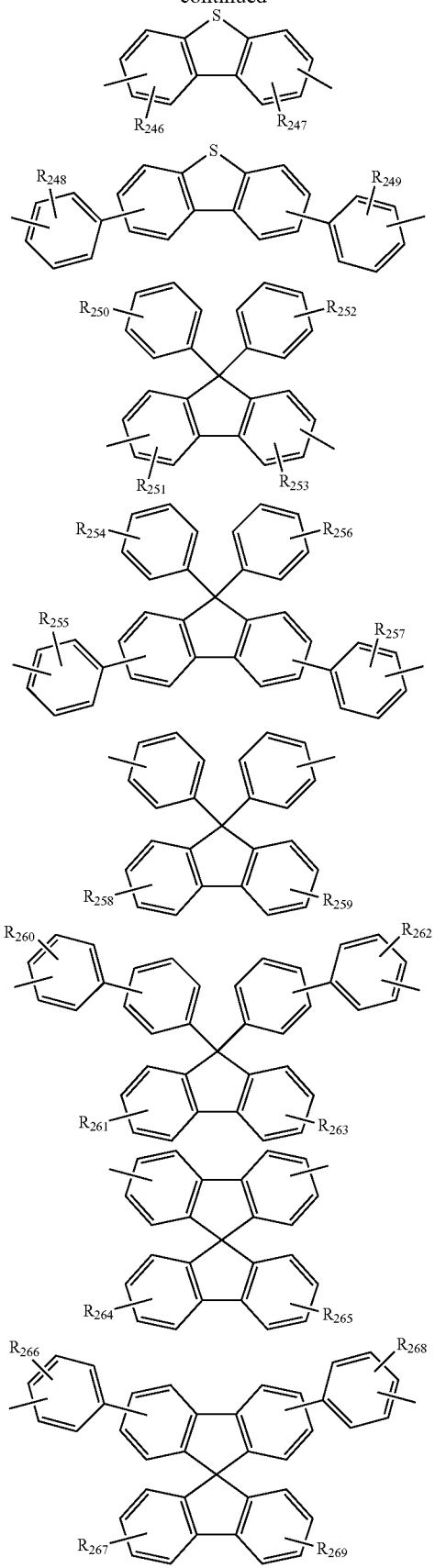

In addition, in Chemical Formula (1), $R_1$ is independently a hydrogen atom, or a C1 to C12 linear, branched, or cyclic hydrocarbon group, or a C6 to C25 divalent aromatic hydrocarbon group, each of which may be optionally substituted. Herein, the C1 to C12 linear, branched, or cyclic hydrocarbon group may include, for example, linear or branched alkyl group, alkenyl group, alkynyl group, or cycloalkyl group, but is not particularly limited thereto. When $R_1$ is an alkenyl group or an alkynyl group, the carbon number of $R_1$ is greater than or equal to 2 and less than or equal to 12. Similarly, when $R_1$ is a cycloalkyl group, the carbon number of $R_1$ is greater than or equal to about 3 and less than or equal to about 12.

The C1 to C12 alkyl group may include, for example, a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 2-methylpentyl group, a 1,2-dimethylbutyl group, an n-heptyl group, a 1,4-dimethylpentyl group, a 3-ethylpentyl group, a 2,4-dimethylpentyl group, a 1-ethyl-3-methylbutyl group, an n-octyl group, a 2-ethylhexyl group, a 2,3-dimethylhexyl group, a 2-methyl-1-isopropyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, or the like.

The C2 to C12 alkenyl group may include a vinyl group, an allyl group, a 1-propenyl group, a 2-butenyl group, a 1,3-butenthienyl group, a 2-pentenyl group, an isopropenyl group, or the like.

The C2 to C12 alkynyl group may include, for example, an ethynyl group, or a propargyl group.

The C3 to C12 cycloalkyl group may include, for example, a cyclopropyl group, a cyclobutyl group, a cyclopentyl group, a cyclohexyl group, or the like.

Of these, $R_1$ is independently a hydrogen atom or a C1 to C12 linear or branched alkyl group. In terms of a higher triplet energy level and a lower driving voltage, $R_1$ is more desirably a hydrogen atom or a C3 to C6 linear alkyl group.

In addition, a polymerization degree of the structural unit (A) may be, for example, an integer from about 5 to about 1,000, but is not particularly limited thereto. In terms of a higher triplet energy level and a lower driving voltage, the polymerization degree of the structural unit (A) is desirably greater than or equal to about 5 and less than or equal to about 500, more desirably greater than or equal to about 10 and less than or equal to about 300, and particularly desirably greater than or equal to about 10 and less than or equal to about 150.

In the present embodiment, in terms of further improvement of the triplet energy level and hole transport capability, and further decreasing a driving voltage, the structural unit (A) represented by Chemical Formula (1) is desirably structural units represented by Chemical Formula (A-1) to Chemical Formula (A-4). Desirably, the structural unit (A) represented by Chemical Formula (1) is a structural unit represented by Chemical Formula (A-1). In the following description and formulas, "Alkyl" means unsubstituted or substituted with an alkyl group. Desirably, "Alkyl" means no substitution with an alkyl group (i.e., Alkyl=hydrogen atom) or substitution with a linear or branched C1 to C18 alkyl group. More desirably, "Alkyl" means unsubstitution or substitution with a linear or branched C3 to C6 alkyl group. In addition, each "Alkyl" may be the same alkyl group or a different alkyl group.

A-1

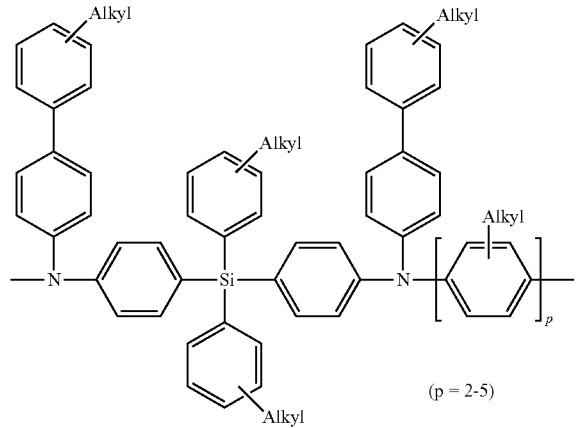

(p = 2-5)

A-2

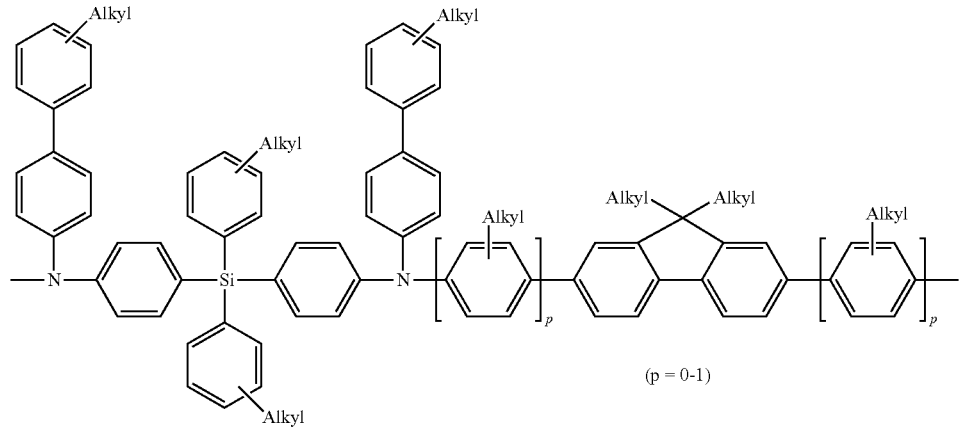

(p = 0-1)

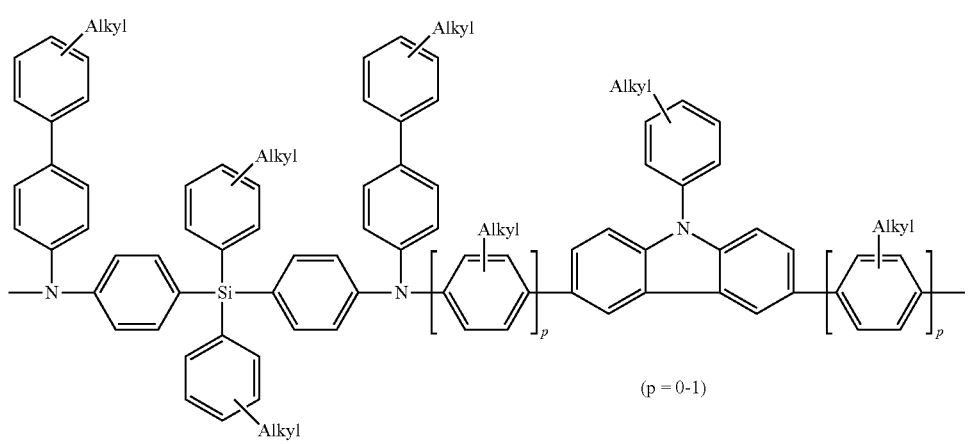

A-3

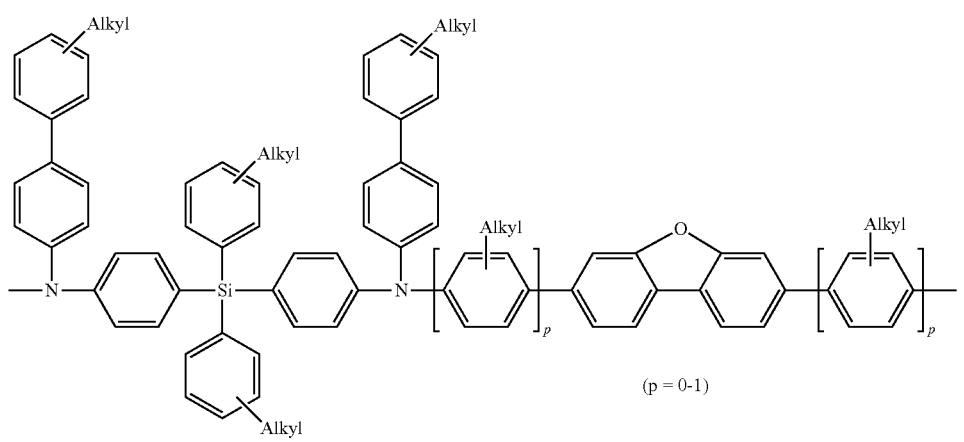

A-4

A composition of the structural unit (A) in the arylamine polymer including silicon is not particularly limited. Considering the effect of further improving the hole transport capability of the layer (for example, hole injection layer, hole transport layer) formed using the obtained arylamine polymer including silicon, the structural unit (A) may be desirably included in an amount of greater than equal to about 10 mol % and less than or equal to about 100 mol %, more desirably greater than equal to about 50 mol % and less than or equal to about 100 mol %, and particularly desirably about 100 mol % based on a total structural unit constituting the arylamine polymer including silicon. That is, in the desirable form of the present embodiment, the structural unit (A) is included in a ratio of greater than or equal to about 10 mol % and less than or equal to about 100 mol % based on a total of the structural units of the polymer. In the more desirable form of the present embodiment, the structural unit (A) is included in a ratio of greater than or equal to about 50 mol % and less than or equal to about 100 mol % based on a total structural unit. In the particularly desirable form of the present embodiment, the arylamine polymer including silicon consists of structural units (A) alone. When the arylamine polymer including silicon includes two or more structural units (A), a content of the structural unit (A) means the total amount of the structural units (A).

As described above, the arylamine polymer including silicon may be composed of the structural unit (A), in particular structural units A-1 to A-4 alone. Alternatively, the arylamine polymer including silicon may further include a structural unit (B) other than the structural unit (A). In the case of including other structural units (B), the other structural units (B) are not particularly limited as long as they do not inhibit effects of the arylamine polymer including silicon (particularly high triplet energy level, low driving voltage, etc.). Specifically, the other structural unit (B) may be represented by the following groups.

Structural Unit (B)

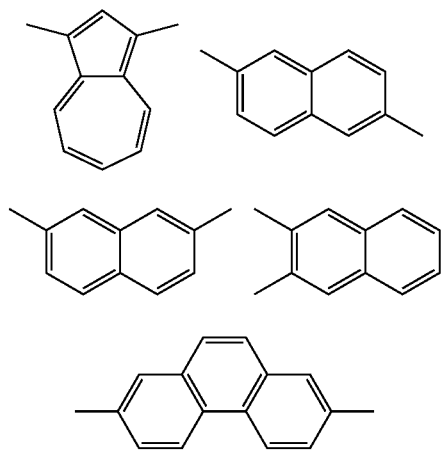

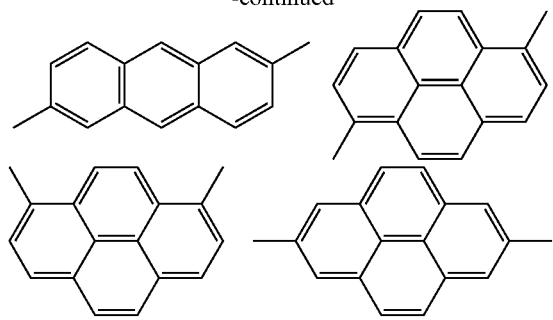

The composition of the structural unit (B) in the arylamine polymer including silicon of the present embodiment is not particularly limited. Considering the ease of film formation by the obtained polymer compound and the further improvement effect of the film strength, the structural unit (B) is desirably included in an amount of greater than or equal to about 1 mol % and less than or equal to about 10 mol % based on a total structural unit constituting the arylamine polymer including silicon. When the arylamine polymer including silicon includes two or more structural units (5-B), a content of the structural unit (B) means the total amount of the structural units (B).

When the arylamine polymer including silicon is composed of two or more structural units, the structure of the arylamine polymer including silicon is not particularly limited. The arylamine polymer including silicon may be any of a random copolymer, an alternate copolymer, a periodic copolymer, and a block copolymer.

The weight average molecular weight (Mw) of the silicon-containing arylamine polymer is not particularly limited as long as the effect of the present disclosure is obtained. The weight average molecular weight (Mw) may be, for example, about 10,000 to about 500,000, or about 20,000 to about 300,000. Within the weight average molecular weight ranges, viscosity of the coating liquid including the arylamine polymer including silicon to form a layer (for example, hole injection layer or hole transport layer) may be appropriately adjusted to provide a layer having a uniform film thickness.

The number average molecular weight (Mn) of the arylamine polymer including silicon is not particularly limited as long as the effect of the present disclosure is obtained. The number average molecular weight (Mn) may be, for example, about 10,000 to about 500,000, or about 10,000 to about 200,000. Within the number average molecular weight ranges, viscosity of the coating liquid including the arylamine polymer including silicon to form a layer (for example, hole injection layer or hole transport layer) may be appropriately adjusted to provide a layer having a uniform film thickness. The polydispersity (weight average molecular weight/number average molecular weight) of the arylamine polymer including silicon of the present embodiment may be, for example, about 1.2 to about 4.0, or about 1.5 to about 3.5.

In the present specification, the measurement of the number average molecular weight (Mn) and the weight average molecular weight (Mw) is not particularly limited and may be applied by using a known method or by appropriately changing the known methods. In the present specification, the number average molecular weight (Mn) and the weight average molecular weight (Mw) use values measured by the following method. The polydispersity (Mw/Mn) of the polymer is calculated by dividing the weight average molecular weight (Mw) by the number average molecular weight (Mn) measured by the following method.

Measurement of Number Average Molecular Weight (Mn) and Weight Average Molecular Weight (Mw)

The number average molecular weight (Mn) and the weight average molecular weight (Mw) of the polymer material are measured under the following conditions by SEC (Size Exclusion Chromatography) using polystyrene as a standard material.

SEC Measurement Condition

Analysis equipment (SEC): Shimadzu Corporation, Prominence

Column: Polymer Laboratories, PLgel MIXED-B

Column temperature: 40° C.

Flow rate: 1.0 mL/min

Injection amount of sample solution: 20 μL (concentration: about 0.05 weight percent)

Eluent: tetrahydrofuran (THF)

Detector (UV-VIS detector): Shimadzu Corporation, SPD-10AV

Standard sample: polystyrene.

The main chain terminal end of the arylamine polymer including silicon is not particularly limited, but is usually hydrogen depending on the type of the used raw material.

The arylamine polymer including silicon may be synthesized by using a known organic synthesis method. The specific synthesis method of the arylamine polymer including silicon may be easily understood by a person of an ordinary skill in the art referring to the following examples. Specifically, the arylamine polymer including silicon may be prepared by a polymerization reaction using at least one monomer (1)' represented by Chemical Formula (1)', or by a copolymerization reaction at least one monomer (1)' represented by Chemical Formula (1)' and the other structural units. The monomers used for the polymerization of the arylamine polymer including silicon may be synthesized by appropriately combining a known synthesis reaction, and their structures may be confirmed by known methods (for example, NMR, LC-MS, etc.).

(1')

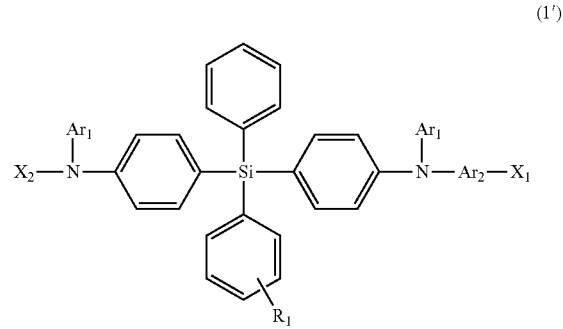

In Chemical Formula (1)', $Ar_1$, $Ar_2$, and $R_1$ are the same as defined in Chemical Formula (1). In addition, $X_1$ and $X_2$ are independently a halogen atom (a fluorine atom, a chlorine atom, a bromine atom, an iodine atom, particularly a bromine atom) or a group having the following structure. In the following structure, $R_A$ to $R_D$ are independently a C1 to C3 alkyl group. Desirably, $R_A$ to $R_D$ may be a methyl group.

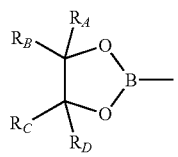

The arylamine polymer including silicon according to the present embodiment includes a structural unit (A). Thereby, it has a high triplet energy level and a low driving voltage. In addition, when using the arylamine polymer including silicon according to the present embodiment as a hole injection material or a hole transporting material (particularly hole transporting material), current efficiency may be improved. In addition, when the arylamine polymer including silicon of the present embodiment is used in an electroluminescence device, high charge mobility is achieved. For this reason, when the arylamine polymer including silicon of this embodiment is used as a hole transporting material, a degradation effect on electrons may be small and a life-span (driving life-span) of the device may be improved. Therefore, an electroluminescence device using the arylamine polymer including silicon according to the present embodiment has excellent luminous efficiency and durability. In addition, when the arylamine polymer including silicon according to the present embodiment has another structural unit having a cross-linking group, coating film stability may be improved. Thereby, light emitting characteristics and stability may be improved when the electroluminescence device is formed into a laminate structure.

Electroluminescence Device Material

The arylamine polymer including silicon according to the present embodiment is desirably used as an electroluminescence device material. The arylamine polymer including silicon may provide an electroluminescence device material having a high triplet energy level (current efficiency) and a low driving voltage. In addition, the arylamine polymer including silicon may provide an electroluminescence device material having high charge mobility and excellent durability. In addition, the main chain of the arylamine polymer including silicon (structural unit of Chemical Formula (1)) has an appropriate flexibility. Accordingly, the arylamine polymer including silicon according to the present embodiment exhibits high solubility and high heat resistance to the solvent. Therefore, it may be easily formed into a film (thin film) by the wet (coating) method. Thus, in a second embodiment, an electroluminescence device material that includes the arylamine polymer including silicon is provided. Alternatively, the arylamine polymer including silicon may be used as an electroluminescence device material. The purpose (or effect) of the present disclosure may also be achieved with an electroluminescence device material according to this embodiment. In addition, the electroluminescence device material is an example of the electroluminescence device material according to the present disclosure.

In addition, an electroluminescence device includes a pair of electrodes, at least one organic film disposed between a pair of electrodes and including the arylamine polymer including silicon or the electroluminescence device material according to the present embodiment. Thus, in a third embodiment, the present disclosure provides an electroluminescence device including a first electrode and a second electrode, and at least one organic film disposed between the first electrode and the second electrode wherein at least one layer of the organic film includes the arylamine polymer including silicon. The purpose (or effect) of the present disclosure may also be achieved by the electroluminescence device. As a desirable form, the electroluminescence device further includes a light emitting layer including a light emitting material disposed between the electrodes and capable of emitting light from triplet excitons. The electroluminescence device is an example of an electroluminescence device according to the present disclosure.

In addition, the present embodiment provides a method of manufacturing an electroluminescence device that includes a pair of electrodes and at least one organic film disposed between the electrodes and including the arylamine polymer including silicon as described herein. At least one of the layers is formed by a coating method. In addition, by this method, an electroluminescence device in which at least one layer of the organic film is formed by a coating method.

The electroluminescence device material (EL device material) has excellent solubility with respect to organic solvents. Accordingly, the EL device material is particularly used for the production of devices (particularly thin films) by a coating method (wet process). Accordingly, the present embodiment provides a liquid composition including the arylamine polymer including silicon and a solvent or a disperse medium. Such a liquid composition is an example of a liquid composition according to the present disclosure.

In addition, as described above, the electroluminescence device material according to the embodiment is desirably used for the production of devices (particularly thin films) by a coating method (wet process). In view of this, the present embodiment provides a thin film that includes the arylamine polymer including silicon. Such a thin film is an example of a thin film according to the present disclosure.

In addition, the EL device material according to the present embodiment has improved charge mobility. For this reason, it may be also desirably used in formation of any one organic film of a hole injection material, a hole transporting material, or a light emitting material (host). Among them, from the viewpoint of hole transportability, it may be used as a hole injection material or a hole transporting material, and particularly a hole transporting material.

That is, the present embodiment provides a composition including the arylamine polymer including silicon and at least one material including a hole transporting material, an electron transporting material, or a light emitting material. Here, the light emitting material included in the composition is not particularly limited, but may include an organic metal complex (light emitting organic metal complex compound) or a semiconductor nanoparticle (semiconductor inorganic nanoparticle).

Electroluminescence Device

Hereinafter, referring to FIG. 1, an electroluminescence device according to the present embodiment is described in detail. FIG. 1 is a schematic view showing an electroluminescence device according to the present embodiment. In addition, in this specification, an "electroluminescence device" may be abbreviated as "EL device."

as shown in FIG. 1, the EL device 100 according to the present embodiment includes a substrate 110, a first electrode 120 disposed on the substrate 110, a hole injection layer 130 disposed on the first electrode 120, a hole transport layer 140 disposed on the hole injection layer 130, a light emitting layer 150 disposed on hole transport layer 140, an electron transport layer 160 disposed on light emitting layer 150, an electron injection layer 170 disposed on electron transport layer 160, and a second electrode 180 disposed on the electron injection layer 170.

Herein, the arylamine polymer including silicon is included in, for example, any one organic film (organic layer) disposed between the first electrode 120 and the second electrode 180. Specifically, the arylamine polymer including silicon may be included in the hole injection layer 130 as a hole injection material, in the hole transport layer 140 as a hole transporting material, or in the light emitting layer 150 as a light emitting material (host). The arylamine polymer including silicon may be more desirably included in the hole injection layer 130 as a hole injection material or in the hole transport layer 140 as a hole transporting material. The arylamine polymer including silicon is particularly to be included in the hole transport layer 140 as a hole transporting material. That is, in the desirable form of the present disclosure, the organic film including the arylamine polymer including silicon may be a hole transport layer, a hole injection layer, or a light emitting layer. In a more desirable form of the present disclosure, an organic film including the arylamine polymer including silicon may be a hole transport layer or a hole injection layer. In a particularly desirable form of the present disclosure, an organic film including the arylamine polymer including silicon may be a hole transport layer.

In addition, the organic film including the arylamine polymer including silicon according to the present embodiment/EL device material may be formed by a coating method (solution coating method). Specifically, the organic film may be formed by a solution coating method such as a spin coating method, a casting method, a micro gravure coating method, a gravure coating method, a bar coating method, a roll coating method, a wire bar coating method, a dip coating method, a spray coating method, a screen printing method, a flexographic printing method, an offset printing method, an inkjet printing method, or the like.

As the solvent used in the solution coating method, any solvent may be used as long as it is capable of dissolving the arylamine polymer including silicon/EL device material, and the solvent may be appropriately selected according to types of the arylamine polymer including silicon. For example, the solvent may be toluene, xylene, ethylbenzene, diethylbenzene, mesitylene, propylbenzene, cyclohexylbenzene, dimethoxybenzene, anisole, ethoxytoluene, phenoxytoluene, isopropylbiphenyl, dimethylanisole, phenyl acetate, phenyl propionate, methyl benzoate, ethyl benzoate, cyclohexane, or the like. An amount of the solvent used is not particularly limited, but considering the ease of coating, a concentration of the arylamine polymer including silicon may desirably be greater than or equal to about 0.1-weight percent and less than or equal to about 10 weight percent, or greater than or equal to about 0.5 weight percent and less than or equal to about 5 weight percent.

In addition, the film-formation method of layers other than the organic film including the arylamine polymer including silicon/EL device material is not specifically limited. The layers other than the organic film including the arylamine polymer including silicon according to the present embodiment/EL device material may be formed by, for example, a vacuum deposition method or may be formed by a solution coating method.

The substrate 110 may be a substrate used in a general EL device. For example, the substrate 110 may be a semiconductor substrate such as a lass substrate, a silicon substrate, or the like, or a transparent plastic substrate.

On the substrate 110, a first electrode 120 is formed. The first electrode 120 is specifically a positive electrode, and is formed by a material having a large work function among a metal, an alloy, or a conductive compound. For example, the first electrode 120 may be formed as a transmissive electrode by indium tin oxide ($In_2O_3$—$SnO_2$: ITO), indium zinc oxide ($In_2O_3$—ZnO), tin oxide ($SnO_2$), zinc oxide (ZnO) or the like due to improved transparency and conductivity. The first electrode 120 may be formed as a reflective electrode by laminating magnesium (Mg), aluminum (Al), or the like on the transparent conductive layer. After forming the first electrode 120 on the substrate 110, washing and UV-ozone treatment may be performed as necessary.

On the first electrode 120, a hole injection layer 130 is formed. The hole injection layer 130 is a layer that facilitates injection of holes from the first electrode 120, and may be formed to have a thickness (dry film thickness; the same below) of specifically greater than or equal to about 10 nanometers (nm) and less than or equal to about 1000 nm, or greater than or equal to about 20 nm and less than or equal to about 50 nm.

The hole injection layer 130 may be formed of a known hole injection material. The known hole injection material of the hole injection layer 130 may include, for example, triphenylamine-containing poly(ether ketone) (TPAPEK), 4-isopropyl-4'-methyldiphenyl iodonium tetrakis(pentafluorophenyl)borate (PPBI), N,N'-diphenyl-N,N'-bis-[4-(phenyl-m-tolyl-amino)-phenyl]-biphenyl-4,4'-diamine (DNTPD), copper phthalocyanine, 4,4',4''-tris(3-methylphenylphenylamino)triphenylamine (m-MTDATA), N,N'-di(1-naphthyl)-N,N'-diphenylbenzidine (NPB), 4,4',4''-tris(diphenylamino)triphenylamine (TDATA), 4,4',4''-tris(N,N-2-naphthylphenylamino)triphenylamine (2-TNATA), polyaniline/dodecylbenzenesulphonic acid, poly(3,4-ethylenedioxythiophene)/poly(4-styrenesulfonate) (PEDOT/PSS), or polyaniline/10-camphorsulfonic acid, or the like.

On the hole injection layer 130, a hole transport layer 140 is formed. The hole transport layer 140 is a layer having a function of transporting holes, and may be formed with a thickness of, for example, greater than or equal to about 10 nm and less than or equal to about 150 nm, and more specifically greater than or equal to about 20 nm and less than or equal to about 50 nm. The hole transport layer 140 may be deposited by a solution coating method using the arylamine polymer including silicon. According to this method, current efficiency of the EL device 100 may be improved and a driving voltage may be decreased. In addition, since the hole transport layer may be formed by the solution coating method, a large area may be formed efficiently.

However, when one organic film of the EL device 100 includes the arylamine polymer including silicon according to the present embodiment, the hole transport layer 140 may be formed of a known hole transporting material. The known hole transporting material may include, for example, 1,1-bis[(di-4-tolylamino) phenyl] cyclohexane (TAPC), a carbazole derivative such as N-phenylcarbazole, polyvinylcarbazole, or the like, N,N'-bis(3-methylphenyl)-N,N'-diphenyl-[1,1-biphenyl]-4,4'-diamine (TPD), 4,4',4''-tris(N-carbazolyl) triphenylamine (TCTA), or N,N'-di(1-naphthyl)-N,N'-diphenylbenzidine (NPB).

On the hole transport layer 140, a light emitting layer 150 is formed. The light emitting layer 150 is a layer that emits light by fluorescence, phosphorescence, or the like, and is formed using a vacuum deposition method, a spin coating method, an inkjet printing method, or the like. The light emitting layer 150 may be formed with a thickness of, for example, about 10 nm to about 60 nm, and more specifically about 20 nm to about 50 nm. As the light emitting material of the light emitting layer 150 may include a known light emitting material. However, the light emitting material included in the light emitting layer 150 is desirably a light emitting material capable of emitting light (i.e., phosphorescence light-emitting) from triplet excitons. In such a case, the driving life-span of the EL device 100 may be further improved.

The light emitting layer 150 is not particularly limited and may have a known configuration. Desirably, the light emitting layer may include a semiconductor nanoparticle or an organic metal complex. That is, in a desirable form of the present disclosure, the organic film has a light emitting layer including semiconductor nanoparticles or organic metal complexes. When the light emitting layer includes semiconductor nanoparticles, the EL device is a quantum dot electroluminescence device (QLED), a quantum dot electroluminescence device, or a quantum dot electroluminescence device. In addition, when the light emitting layer includes an organic metal complex, the EL device is an organic electroluminescence device (OLED).

In the form in which the light emitting layer includes semiconductor nanoparticles (QLED), the light emitting layer may include a plurality of semiconductor nanoparticles (quantum dots) arranged in a single layer or a plurality of layers. Herein, the semiconductor nanoparticles (quantum dots) may be particles of predetermined sizes that have a quantum confinement effect. The diameter of the semiconductor nanoparticles (quantum dots) is not particularly limited but is greater than or equal to about 1 nm and less than or equal to about 10 nm.

The semiconductor nanoparticles (quantum dots) arranged in the light emitting layer may be synthesized by a wet chemical process, an organic metal chemical deposition process, a molecular beam epitaxy process, or another similar process. Among them, the wet chemical process is a method of growing a particle by putting a precursor material in an organic solvent.

In the wet chemistry process, when crystals grow, the organic solvent naturally coordinates to the surface of the quantum dot crystals and acts as a dispersing agent, thereby controlling the growth of the crystals. For this reason, in the wet chemical process, compared with gas phase deposition methods, such as metal organic chemical vapor deposition (MOCVD) and molecular beam epitaxy (MBE), growth of semiconductor nanoparticles may be easily controlled at a low cost.

The semiconductor nanoparticles (quantum dots) may adjust energy bandgaps by adjusting their sizes, so that light of various wavelengths may be obtained from the light emitting layer (quantum dot light emitting layer). Thus, a plurality of differently sized quantum dots may embody a display that discharges (or emits) light of multiple wavelengths. The sizes of the quantum dots may be selected to emit red, green, and blue light to form a color display. In addition, the sizes of the quantum dots may be combined so that various color lights emit white light.

The semiconductor nanoparticles (quantum dots) may be semiconductor material of a Group II-VI semiconductor compound; a Group III-V semiconductor compound; a Group IV-VI semiconductor compound; a Group IV element or compound; or a combination thereof.

The Group II-VI semiconductor compound is not particularly limited, but includes, for example, a binary compound of CdSe, CdTe, ZnS, ZnSe, ZnTe, ZnO, HgS, HgSe, HgTe, or a mixture thereof; a ternary compound of CdSeS, CdSeTe, CdSTe, ZnSeS, ZnTeSe, ZnSTe, HgSeS, HgSeTe, HgSTe, CdZnS, CdZnSe, CdZnTe, CdHgS, CdHgSe, CdHgTe, HgZnS, HgZnSe, HgZnTe, and a quaternary compound of CdZnSeS, CdZnSeTe, CdZnSTe, CdHgSeS, CdHgSeTe, CdHgSTe, HgZnSeS, HgZnSeTe, HgZnSTe, or a mixture thereof.

The Group III-V semiconductor compound is not particularly limited, but includes, for example, a binary compound of GaN, GaP, GaAs, GaSb, AlN, AlP, AlAs, AlSb, InN, InP, InAs, InSb, and a mixture thereof; a ternary compound of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, or a mixture thereof; and a quaternary compound of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof.

The Group IV-VI semiconductor compound is not particularly limited, but includes, for example, a binary compound of SnS, SnSe, SnTe, PbS, PbSe, PbTe, or a mixture thereof; a ternary compound of SnSeS, SnSeTe, SnSTe, PbSeS, PbSeTe, PbSTe, SnPbS, SnPbSe, SnPbTe, or a mixture thereof; and a quaternary compound of SnPbSSe, SnPbSeTe, SnPbSTe, or a mixture thereof.

The Group IV element or compound is not particularly limited, but includes, for example, a single element of Si, Ge, and or mixture thereof; and a binary compound of SiC, SiGe, or a mixture thereof.

The semiconductor nanoparticles (quantum dots) may have a homogeneous single structure or a double structure of a core-shell. The core-shell may comprise different materials. The material constituting each core and shell may be made of different semiconductor compounds. However, an energy bandgap of the shell material is larger than an energy bandgap of the core material. Specifically, structures such as ZnTeSe/ZnSe/ZnS, CdSe/ZnS, InP/ZnS, or the like are desirable.

For example, a process of producing a quantum dot having a core (CdSe)-shell (ZnS) structure is described. First, crystals are formed by injecting core (CdSe) precursor materials of $(CH_3)_2Cd$ (dimethylcadmium), TOPSe (trioctylphosphine selenide) or the like into an organic solvent using TOPO (trioctylphosphine oxide) as a surfactant. At this time, after maintaining a certain time at high temperature so that the crystals grow to a certain size, the precursor materials of the shell (ZnS) are injected, to form a shell on the surface of the core already generated. As a result, a quantum dot of CdSe/ZnS capped with TOPO may be produced.

In addition, in the form in which the light emitting layer includes an organic metal complex (OLED), the light emitting layer 150 may include, for example 6,9-diphenyl-9'-(5'-phenyl-[1,1':3',1"-terphenyl]-3-yl)3,3'-bi[9H-carbazole], 3,9-diphenyl-5-(3-(4-phenyl-6-(5'-phenyl-[1,1':3',1"-terphenyl]-3-yl)-1,3,5,-triazin-2-yl)phenyl)-9H-carbazole, 9,9'-diphenyl-3,3'-bi[9H-carbazole], tris(8-quinolinato)aluminium ($Alq_3$), 4,4'-bis(carbazol-9-yl)biphenyl (CBP), poly(n-vinyl carbazole) (PVK), 9,10-di(naphthalene)anthracene (ADN), 4,4',4"-tris(N-carbazolyl)triphenylamine (TCTA), 1,3,5-tris (N-phenyl-benzimidazol-2-yl)benzene (TPBI), 3-tert-butyl-9,10-di(naphth-2-yl)anthracene (TBADN), distyrylarylene (DSA), 4,4'-bis (9-carbazole)-2,2'-dimethyl-bipheny (dmCBP), or the like, as a host material.

In addition, the light emitting layer 150 may include, for example, perylene and a derivative thereof, rubrene and a derivative thereof, coumarin and a derivative thereof, 4-dicyanomethylene-2-(pdimethylaminostyryl)-6-methyl-4H-pyran (DCM) and a derivative thereof, an iridium (Ir) complex such as bis[2-(4,6-difluorophenyl)pyridinate]picolinate iridium(III) (FIrpic)), bis(1-phenylisoquinoline) (acetylacetonate)iridium(III) ($Ir(piq)_2(acac)$), tris(2-phenylpyridine)iridium(III) ($Ir(ppy)_3$), tris(2-(3-p-xylyl)phenyl) pyridine iridium (III), an osmium (Os) complex, a platinum complex, or the like, as a dopant material. Among these, it is desirable that the light emitting material is a light emitting organic metal complex compound.

A method for forming the light emitting layer is not particularly limited. It may be formed by coating (solution coating method) coating liquid including a semiconductor nanoparticle or an organic metal complex. At this time, it is desirable to select a solvent which does not dissolve the materials (hole transporting material, particularly the arylamine polymer including silicon) in the hole transport layer as the solvent constituting the coating liquid.

On the light emitting layer 150, an electron transport layer 160 is formed. The electron transport layer 160 is a layer having a function of transporting electrons, and is formed using a vacuum deposition method, a spin coating method, an inkjet method, or the like. For example, the electron transport layer 160 may be formed to have a thickness of greater than or equal to about 15 nm and less than or equal to about 50 nm.

The electron transport layer 160 may be formed of a known electron transporting material. The known electron transporting material may include, for example, (8-quinolinato) lithium (lithium quinolate) (Liq), tris(8-quinolinato) aluminium (Alq3) and a compound having a nitrogen-containing aromatic ring. Examples of the compound having the nitrogen-containing aromatic ring may include, for example, a compound including a pyridine ring such as 1,3,5-tri[(3-pyridyl)-phen-3-yl]benzene), a compound including a triazine ring such as 2,4,6-tris(3'-(pyridin-3-yl)biphenyl-3-yl)-1,3,5-triazine), a compound including an imidazole ring such as 2-(4-(N-phenylbenzoimidazolyl-1-yl-phenyl)-9,10-dinaphthylanthracene or 1,3,5-tris(N-phenyl-benzimidazol-2-yl)benzene: TPBI). The electron transporting material may be used alone or as a mixture of two or more thereof.

On the electron transport layer 160, an electron injection layer 170 is formed. The electron injection layer 170 is a layer having a function of facilitating injection of electrons from the second electrode 180. The electron injection layer 170 is formed using a vacuum deposition method or the like. The electron injection layer 170 may be formed to have a thickness of greater than or equal to about 0.1 nm and less than or equal to about 5 nm, and more specifically, greater than or equal to about 0.3 nm and less than or equal to about 2 nm. As a material for forming the electron injection layer 170, any known material may be used. For example, the electron injection layer 170 may be formed of a lithium compound such as (8-quinolinato) lithium (lithium quinolate) (Liq) and lithium fluoride (LiF), sodium chloride (NaCl), cesium fluoride (CsF), lithium oxide (Li$_2$O), or barium oxide (BaO).

On the electron injection layer 170, a second electrode 180 is formed. The second electrode 180 is formed using a vacuum deposition method or the like. Specifically, the second electrode 180 is a cathode, and is formed by a material having a small work function among metals, alloys, or conductive compounds. For example, the second electrode 180 is may be formed as a reflective electrode with a metal such as lithium (Li), magnesium (Mg), aluminum (Al), calcium (Ca), or aluminum-lithium (Al—Li), magnesium-indium (Mg—In), magnesium-silver (Mg—Ag), or the like. The second electrode 180 may be formed to have a thickness of greater than or equal to about 10 nm and less than or equal to about 200 nm, and more and specifically, greater than or equal to about 50 nm and less than or equal to about 150 nm. Alternatively, the second electrode 180 may be formed as a transmissive electrode by a thin film of less than or equal to about 20 nm of a metal material or a transparent conductive layer such as indium tin oxide (In$_2$O$_3$—SnO$_2$), and indium zinc oxide (In$_2$O$_3$—ZnO).

The EL device 100 according to the present embodiment has been described above as an example of the electroluminescence device according to the present disclosure. The organic light emitting device 100 according to the present embodiment further improves luminous efficiency (current efficiency) and reduces a driving voltage by installing an organic film (particularly a hole transport layer or a hole injection layer) including the arylamine polymer including silicon.

The laminate structure of the EL device 100 according to the present embodiment is not limited to the above embodiments. The EL device 100 according to the present embodiment may have another known laminate structure. For example, in the EL device 100, one or more layers of the hole injection layer 130, the hole transport layer 140, the electron transport layer 160 and the electron injection layer 170 may be omitted or another layer may be further included. In addition, each layer of the EL device 100 may be formed in a single layer or in a plurality of layers.

For example, the EL device 100 may further include a hole blocking layer between the hole transport layer 140 and the light emitting layer 150 in order to prevent excitons or holes from diffusing into the electron transport layer 160. The hole blocking layer may be formed by, for example, an oxadiazole derivative, a triazole derivative, or a phenanthroline derivative.

In addition, the arylamine polymer including silicon according to the present embodiment may be applied to electroluminescence devices other than the QLED or OLED. Other electroluminescence devices to which the arylamine polymer including silicon according to the present embodiment may be applied may include, but are not particularly limited to, for example, organic inorganic perovskite light emitting devices.

EXAMPLES

The present disclosure is described in more detail using the following Examples and Comparative Examples. However, the technical range of the present disclosure is not limited to the following Examples. In the following Examples, unless specifically described, each operation was performed at room temperature (25° C.). In addition, unless specifically stated, "%" and "a part" mean "weight percent" and "a part by mass", respectively.

SYNTHESIS EXAMPLE 1

Synthesis of Compounds A-1 and A-2
Compounds A-1 and A-2 are synthesized according to the following reaction.

Chemical Formula 10

Chemical Formula 10

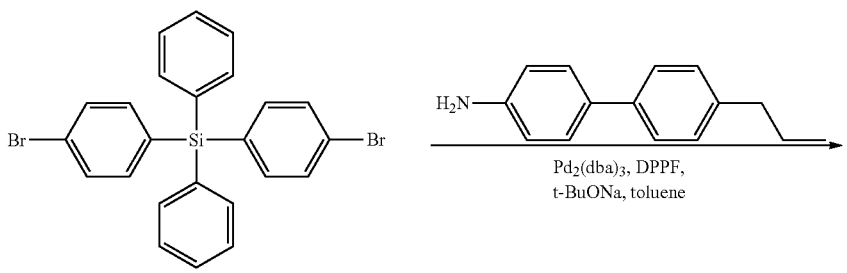

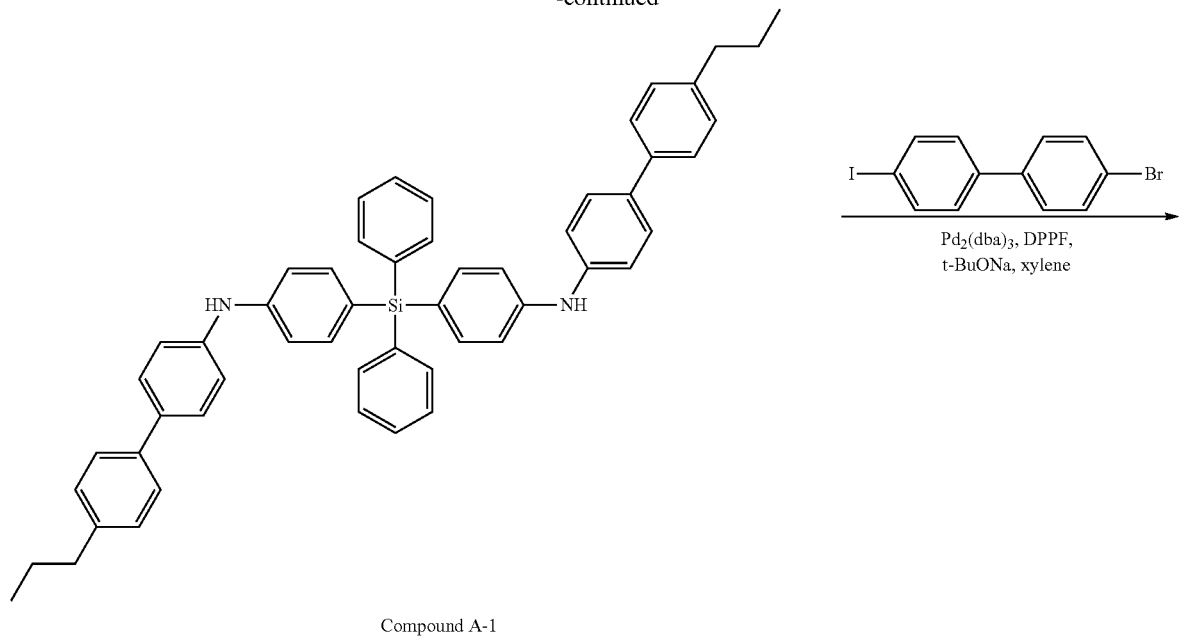

Compound A-1

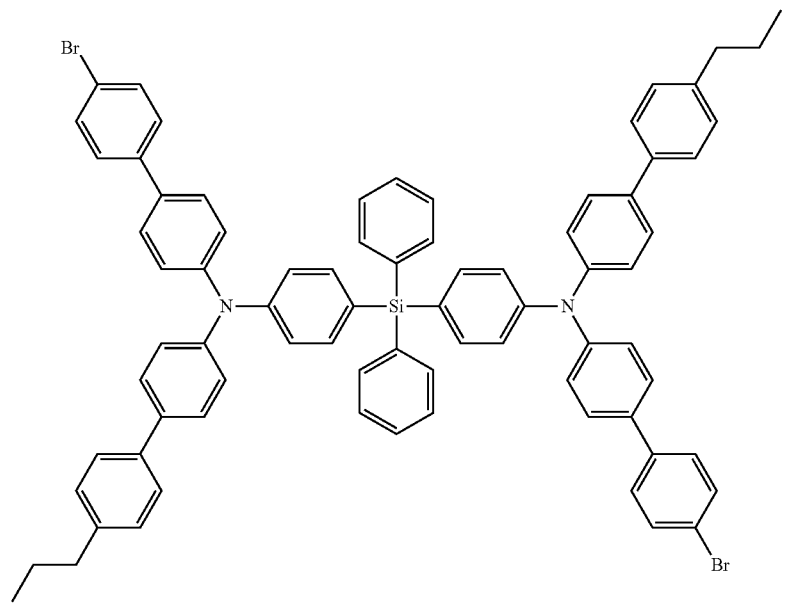

Compound A-2

Bis(4-bromophenyl)diphenylsilane (10.5 grams (g)), 4'-propyl-[1,1'-biphenyl]-4-amine (10.5 g), tris(dibenzylideneacetone)dipalladium (Pd$_2$(dba)$_3$, 0.371 g), 1,1'-bis(diphenyl phosphino)ferrocene (DPPF, 0.448 g), sodium tert-butoxide (t-BuONa, 5.83 g), and 200 milliliters (mL) of toluene are put in a 4-necked flask substituted with argon and heated at 95° C. for 2 hours. The flask is cooled down to room temperature (25° C.; hereinafter, the same), and insoluble matters are filtered with Celite. After distilling and removing the solvent under a reduced pressure, the filtrate is purified through column chromatography to obtain Compound A-1 (11.5 g).

Compound A-1 (10.0 g), 4-bromo-4'-iodine-1,1'-biphenyl (14.2 g), tris(dibenzylideneacetone)dipalladium (Pd$_2$(dba)$_3$, 0.606 g), 1,1'-bis(diphenyl phosphino)ferrocene (DPPF, 1.47 g), sodium tert-butoxide (t-BuONa, 5.09 g), and 200 mL of xylene are put in a 4-necked flask substituted with argon and then, heated at 120° C. for 2 hours. The reaction solution is cooled down to room temperature (25° C.), and insoluble matters therein are filtered with Celite. After distilling and removing the solvent under a reduced pressure, the filtrate is purified through column chromatography to obtain Compound A-2 (9.50 g).

SYNTHESIS EXAMPLE 2

Synthesis of Compound B-1

Compound B-1 is synthesized according to the following reaction.

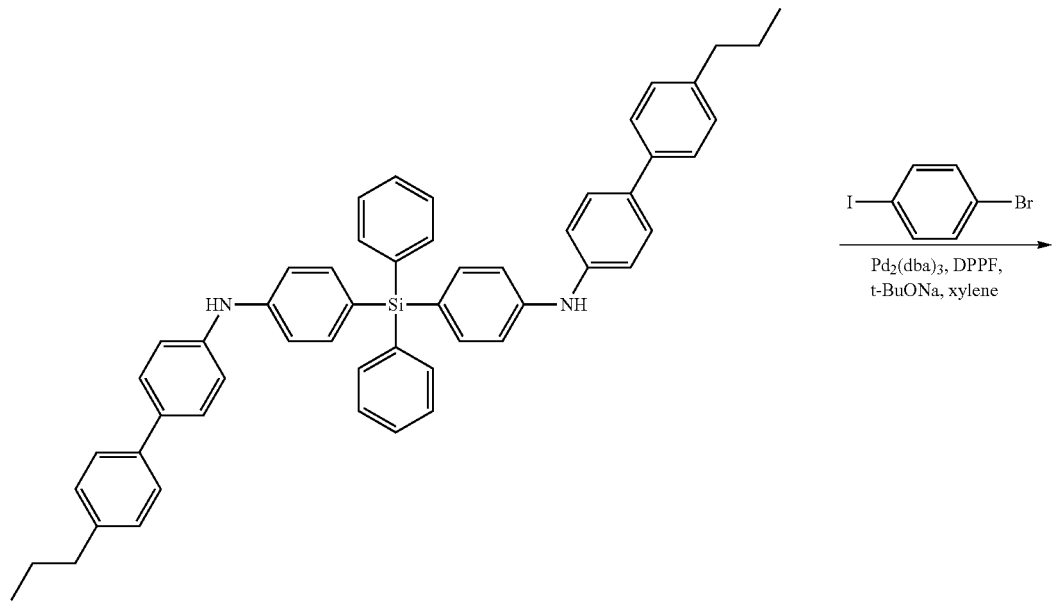

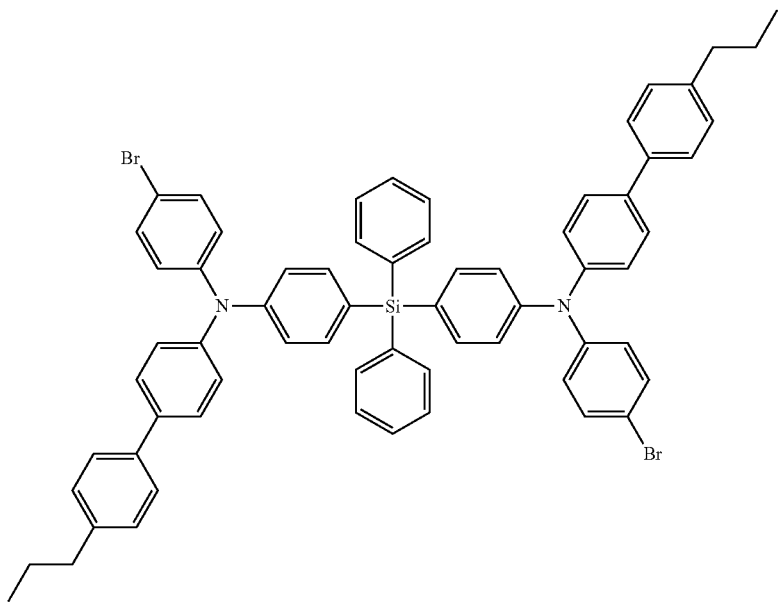

Compound B-1

N,N'-((diphenylsilanediyl)bis(4,1-phenylene))(bis(4'-propyl[1,1'-biphenyl]-4-amine) (10.0 g), 4-bromo-1-iodobenzene (11.2 g), tris(dibenzylideneacetone)dipalladium ($Pd_2(dba)_3$, 0.606 g), 1,1'-bis(diphenyl phosphino)ferrocene (DPPF, 1.47 g), sodium tert-butoxide (t-BuONa, 5.09 g), and 130 mL of xylene are put in a 4-necked flask substituted with argon and then, heated at 120° C. for 2 hours. The reaction solution is cooled down to room temperature, and insoluble matters therein are filtered with Celite. After distilling and removing the solvent under a reduced pressure, the filtrate is purified through column chromatography to obtain Compound B-1 (8.60 g).

SYNTHESIS EXAMPLE 3

Synthesis of Compound C-1

Compound C-1 is synthesized according to the following reaction.

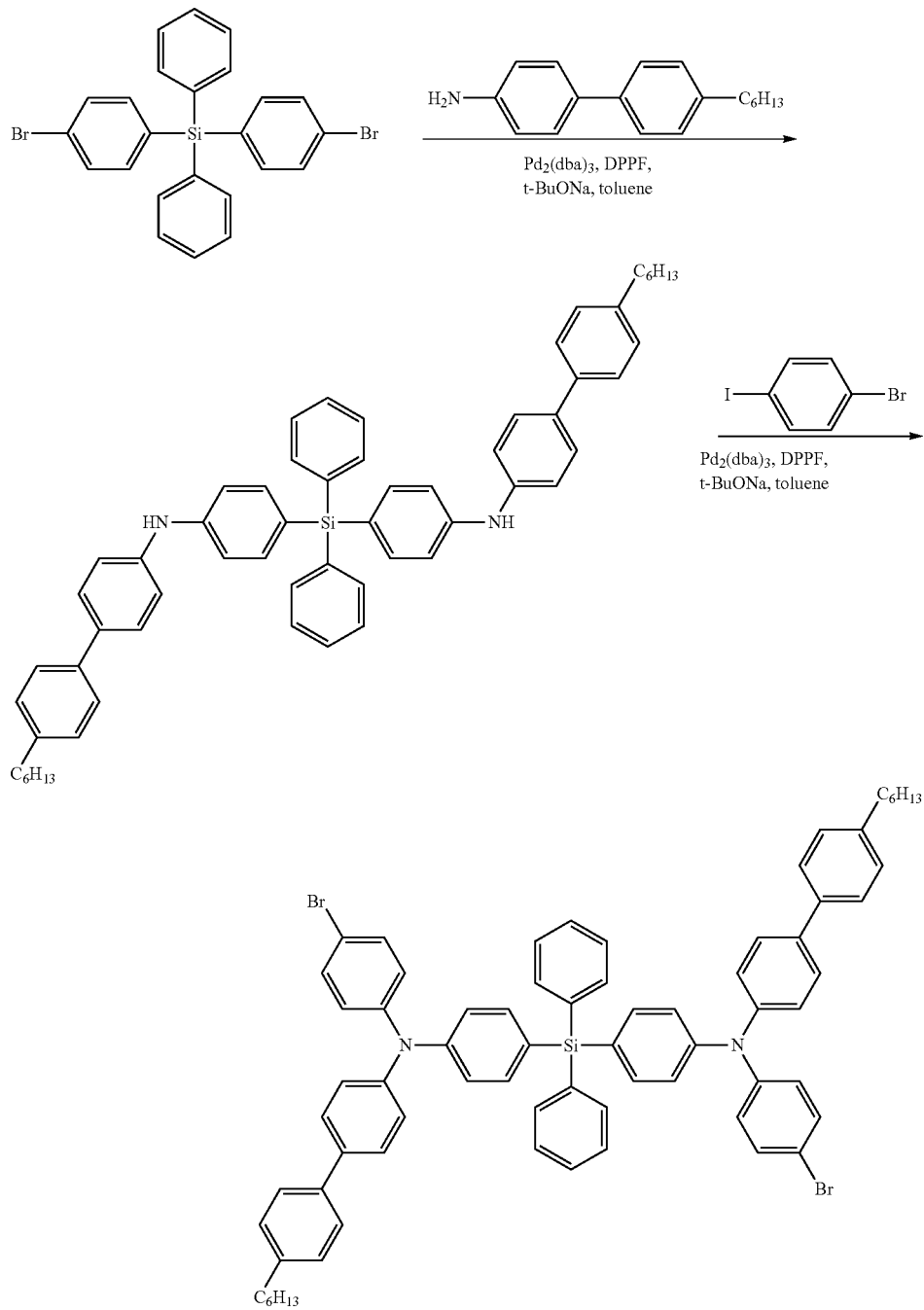

Compound C-1

Bis(4-bromophenyl)diphenylsilane (10.5 g), 4'-hexyl-[1,1'-biphenyl]-4-amine (12.6 g), tris(dibenzylideneacetone)dipalladium ($Pd_2(dba)_3$, 0.371 g), 1,1'-bis(diphenyl phosphino)ferrocene (DPPF, 0.448 g), sodium tert-butoxide (t-BuONa, 5.83 g), and 200 mL of toluene are put in a 4-necked flask substituted with argon and then, heated at 95° C. for 2 hours. The flask is cooled down to room temperature, and insoluble matters therein are filtered with Celite. The solvent is distilled and removed from the filtrate under a reduced pressure and then, purified through column chromatography to obtain N,N'-((diphenylsilanediyl)bis(4,1-phenylene)) (12.5 g).

N,N'-((diphenylsilanediyl) bis(4,1-phenylene))(bis(4'-hexyl[1,1'-biphenyl]-4-amine) (10.0 g), 4-bromo-1-iodine benzene (14.2 g), tris(dibenzylideneacetone)dipalladium ($Pd_2(dba)_3$, 0.606 g), 1,1'-bis(diphenyl phosphino)ferrocene (DPPF, 1.47 g), sodium tert-butoxide (t-BuONa, 5.09 g), and 200 mL of xylene are put in a 4-necked flask substituted with argon and then, heated at 120° C. for 2 hours. The reaction solution is cooled down to room temperature, and insoluble matters therein are filtered with Celite. After distilling and removing the solvent under a reduced pressure, the filtrate is purified through column chromatography to obtain Compound C-1 (10.80 g).

SYNTHESIS EXAMPLE 4

Synthesis of Compounds D-1 and D-2

Compounds D-1 and D-2 are synthesized according to the following reaction.

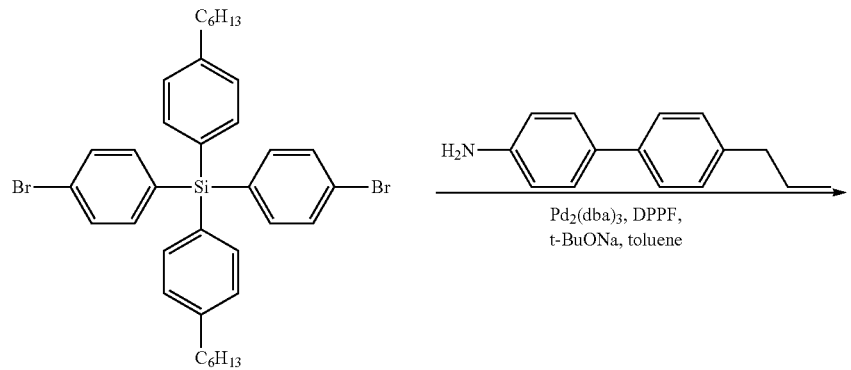

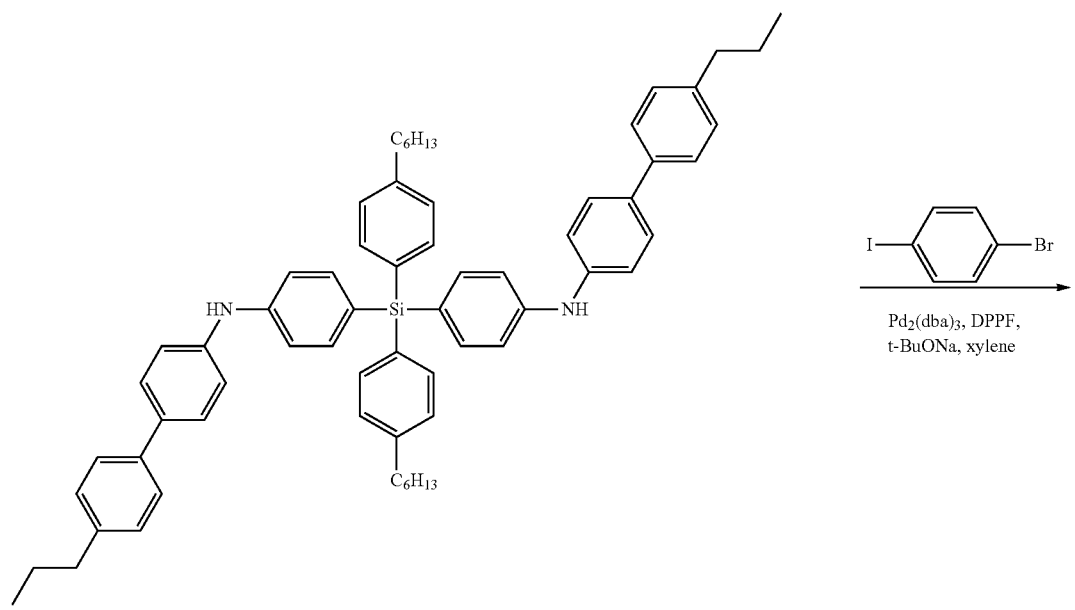

Compound D-1

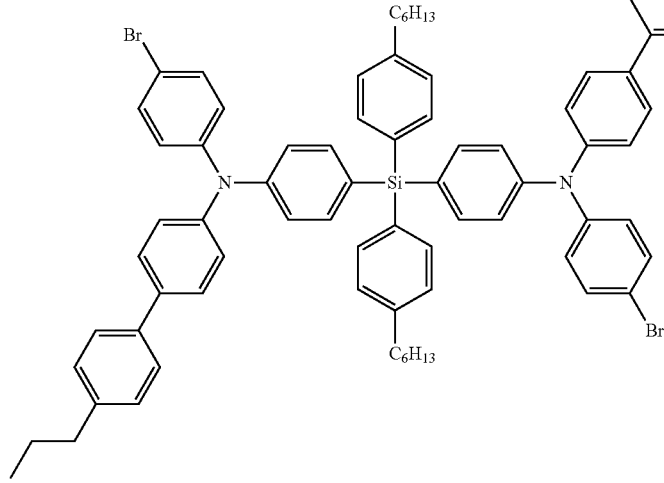

Compound D-2

Bis(4-bromophenyl)bis(4-hexylphenyl)silane (20.0 g), 4'-propyl-[1,1'-biphenyl]-4-amine (15.9 g), tris(dibenzylideneacetone)dipalladium ($Pd_2(dba)_3$, 0.552 g), 1,1'-bis(diphenyl phosphino)ferrocene (DPPF, 0.669 g), sodium tert-butoxide (t-BuONa, 5.83 g), and 200 mL of toluene are put in a 4-necked flask substituted with argon and then, heated at 95° C. for 2 hours. The flask is cooled down to room temperature, and insoluble matters therein are filtered with Celite. After distilling and removing the solvent under a reduced pressure, the filtrate is purified through column chromatography to obtain Compound D-1 (22.8 g).

Compound D-1 (20.0 g), 4-bromo-4'-iodine benzene (15.2 g), tris(dibenzylideneacetone)dipalladium ($Pd_2(dba)_3$, 0.396 g), 1,1'-bis(diphenyl phosphino)ferrocene (DPPF, 0.480 g), sodium tert-butoxide (t-BuONa, 4.16 g), and 200 mL of xylene are put in a 4-necked flask substituted with argon and then, heated at 120° C. for 2 hours. The reaction solution is cooled down to room temperature, and insoluble matters therein are filtered with Celite. After distilling and removing the solvent under a reduced pressure, the filtrate is purified through column chromatography to obtain Compound D-2 (20.5 g).

SYNTHESIS EXAMPLE 5

Synthesis of Compounds E-1 and E-2

Compounds E-1 and E-2 are synthesized according to the following reaction.

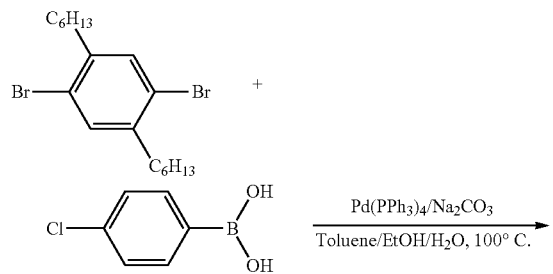

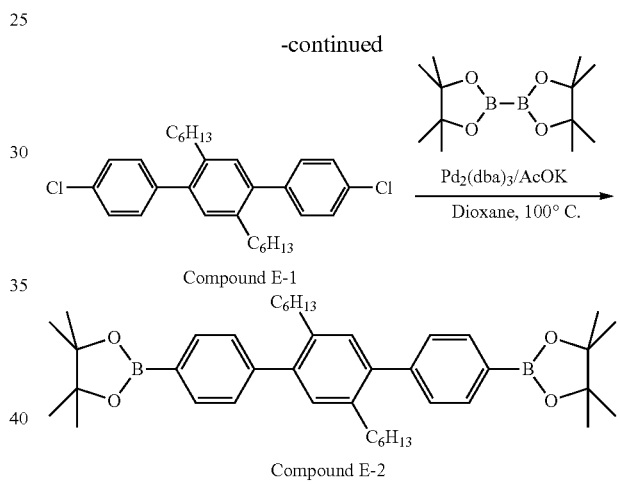

Compound E-1

Compound E-2

1,4-dibromo-2,5-dihexylbenzene (20.0 g), 4-chlorophenyl boronic acid (23.2 g), tetrakis(triphenyl phosphine)palladium ($Pd(PPh_3)_4$, 2.85 g), sodium carbonate ($Na_2CO_3$, 52.4 g), 500 mL of toluene, 250 mL of ethanol, and 125 mL of water are put in a 4-necked flask under argon and then, heated at 100° C. for 15 hours. The reaction solution is cooled down to room temperature, and an organic layer is separated therefrom. In addition, an aqueous layer is extracted with toluene (100 mL×3), combined with the organic layer, washed with water (100 mL×3), and filtered with Celite and silica gel. After distilling and removing the solvent under a reduced pressure, 100 mL of toluene and 10 g of activated clay are added thereto and then, refluxed for 30 minutes and filtered by using Celite, which is twice repeated. After distilling and removing the solvent under a reduced pressure, 50 mL of ethanol is added to the obtained solid and then, refluxed for 30 minutes. The solid is filtered and vacuum-dried to obtain Monomer E-1 (18.5 g).

Compound E-1 (15.0 g), 4,4,4',4',5,5,5',5'-octamethyl-2,2'-bi-1,3,2-dioxaborolane (22.5 g), tris(dibenzylideneacetone)dipalladium ($Pd_2(dba)_3$, 1.46 g), 2-dicyclohexylphosphino-2',4',6'-triisopropylbiphenyl (2.29 g), potassium acetate (AcOK, 18.9 g), and 320 mL of 1,4-dioxane are put in a 4-necked flask under an argon atmosphere and then, heated at 100° C. for 3 hours. The reaction solution is cooled down to room temperature and then, after distilling and removing the solvent under a reduced pressure, filtered by using 300 mL of toluene. 10 g of activated carbon is added to the filtrate and then, refluxed for 30 minutes, which is twice repeated. The solvent is removed under a reduced pressure, and a solid obtained therefrom is recrystallized by using a hexane/ethanol mixed solvent and then, vacuum-dried. Accordingly, Compound E-2 [2,2'-(2,5-dihexyl-[1,1': 4',1''-terphenyl]4,4''-diyl) bis(4,4,5,5-tetramethyl-1,3,2-dioxaborolane)] (19.5 g) is obtained.

Example 1

Compound A-2 (2.13 g) according to Synthesis Example 1, 2,2'-(2,5-dihexyl-1,4-phenylene)bis(4,4,5,5-tetramethyl-1,3,2-dioxaborolane) (0.837 g), palladium acetate (3.9 mg), tris(2-methoxyphenyl)phosphine (37.0 mg), 60 mL of toluene, and a 20 weight percent tetraethylammonium hydroxide aqueous solution (9.03 g) are put in a 4-necked flask under an argon atmosphere and then, heated at 85° C. for 6 hours. Subsequently, phenyl boronic acid (24.2 mg), tetrakis(triphenyl phosphine)palladium (0) (40.5 mg), and a 20 weight percent tetraethylammonium hydroxide aqueous solution (9.03 g) are added thereto and then, stirred for 3 hours. Then, sodium N,N-diethyldithio carbamate hydrate (5.92 g) dissolved in 50 mL of ion exchange water is added thereto and then, stirred at 85° C. for 2 hours. An organic layer is separated from an aqueous layer and then, washed with water, a 3 weight percent acetic acid aqueous solution, and water. The organic layer is passed through column chromatography charged with silica gel/alumina, and the solvent is distilled and removed under a reduced pressure. The obtained liquid is added to methanol in a dropwise fashion, and a solid extracted therefrom is dissolved in toluene. Subsequently, this solution is added to methanol in a dropwise fashion, and a solid extracted therefrom is filtered and dried to obtain Polymer Compound P-1 (1.19 g). A number average molecular weight (Mn) and polydispersity (Mw/Mn) of Polymer Compound P-1 are measured with SEC. As a result, (Mn) and Mw/Mn of Polymer Compound P-1 are respectively 106,000 and 1.94.

Polymer Compound P-1 is expected to have the following structural unit based on an injection ratio of the monomers.

Polymer compound P-1

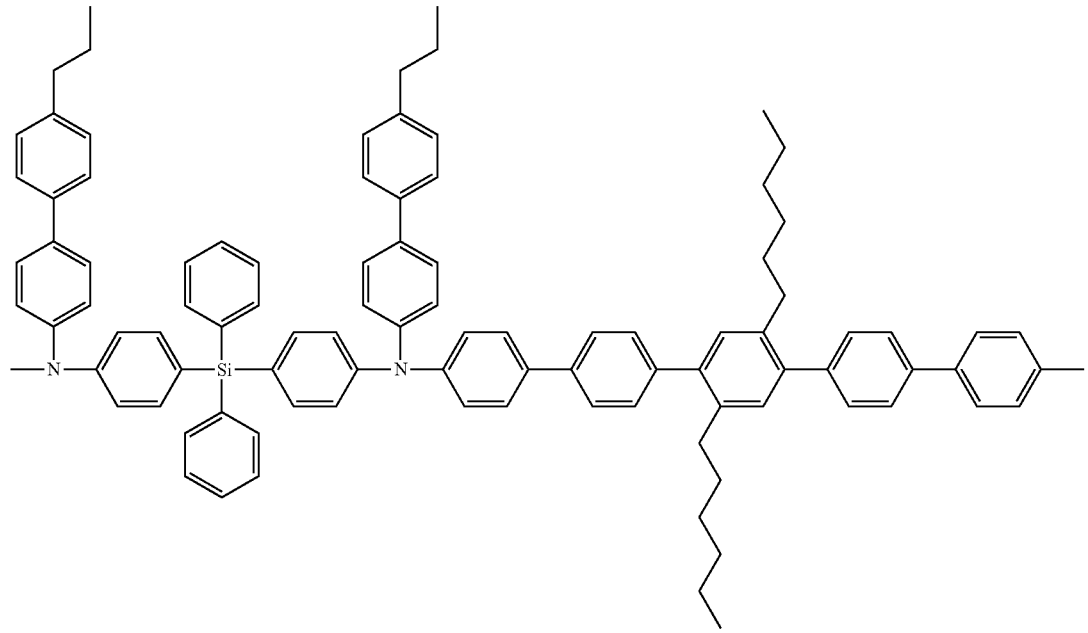

Example 2

Compound B-1 (2.13 g) according to Synthesis Example 2, 2,2'-(2,5-dihexyl-1,4-phenylene)bis(4,4,5,5-tetramethyl-1,3,2-dioxaborolane) (0.999 g), palladium acetate (2.1 mg), tris(2-methoxyphenyl)phosphine (20.2 mg), 60 mL of toluene, and a 20 weight percent tetraethylammonium hydroxide aqueous solution (7.61 g) are put in a 4-necked flask argon atmosphere and then, stirred at 85° C. for 6 hours. Subsequently, phenyl boronic acid (23.3 mg), tetrakis(triphenyl phosphine)palladium (0) (13.4 mg), and a 20 weight percent tetraethylammonium hydroxide aqueous solution (7.61 g) are added thereto and then, stirred for 3 hours. Then, sodium N,N-diethyldithio carbamate 3hydrate (5.40 g) dissolved in 50 mL of ion exchange water is added thereto and then, stirred at 85° C. for 2 hours. An organic layer is separated from an aqueous layer and then, washed with water, a 3 weight percent acetic acid aqueous solution, and water. The organic layer is passed through column chromatography charged with silica gel/alumina, and the solvent is distilled and removed under a reduced pressure. The obtained liquid is added to methanol in a dropwise fashion, and a solid extracted therein is dissolved in toluene. Subsequently, this solution is added to methanol in a dropwise fashion, and a solid extracted therefrom is filtered and dried to obtain Polymer Compound P-2 (1.19 g). A number average molecular weight (Mn) and polydispersity (Mw/Mn) of Polymer Compound P-2 are measured with SEC. As a result, Mn and Mw/Mn of Polymer Compound P-2 are respectively 121,000 g/mol and 1.60.

Polymer Compound P-2 synthesized in this way is expected to have the following structural unit based on an injection ratio of the monomers.

Polymer compound P-2

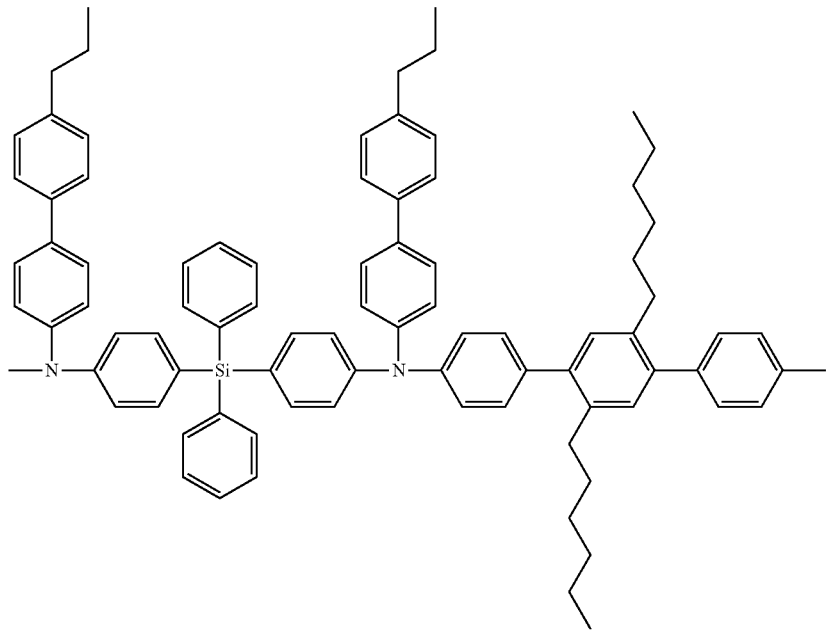

Example 3

Compound A-1 (1.88 g) according to Synthesis Example 1, 4,4'-dibromobiphenyl (0.623 g), tris(dibenzylideneacetone)dipalladium (41.8 mg), tri-tert-butoxyphosphine (13.2 mg), and 20 mL of toluene are put in a 4-necked flask under a argon atmosphere and then, stirred at 65° C. for 6 hours. Subsequently, 4-bromobiphenyl (46.3 mg) is added thereto and then, stirred for 3 hours. Then, sodium N,N-diethyldithio carbamate hydrate (6.81 g) dissolved in 50 mL of ion exchange water is added thereto and then, stirred at 85° C. for 2 hours. An organic layer is separated from an aqueous layer and then, washed with water, a 3 weight percent acetic acid aqueous solution, and water. The organic layer is passed through column chromatography charged with silica gel/alumina, and the solvent is distilled and removed under a reduced pressure. The obtained liquid is added to methanol in a dropwise fashion, and a solid extracted therefrom is dissolved in toluene. Subsequently, this solution is added to methanol in a dropwise fashion, and the extracted solid is filtered and dried to obtain Polymer Compound P-3 (1.66 g). A number average molecular weight (Mn) and polydispersity (Mw/Mn) of Polymer Compound P-3 are measured with SEC. As a result, Mn and Mw/Mn of Polymer Compound P-3 are respectively 89,000 g/mol and 1.89.

Polymer Compound P-3 synthesized in this way is expected to have the following structural unit based on an injection ratio of the monomers.

Polymer compound P-3

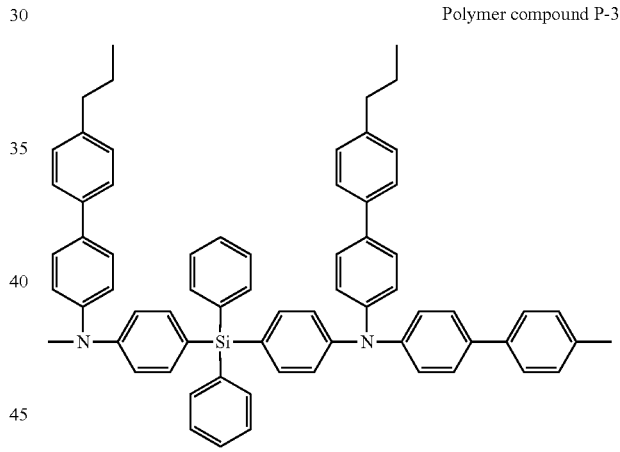

Example 4

Compound B-1 (2.37 g) according to Synthesis Example 2, 4,4'-bis(4,4,5,5-tetramethyl-1,3,2-dioxaborolane-2-yl)biphenyl (0.902 g), palladium acetate (5.0 mg), tris(2-methoxyphenyl)phosphine (47.1 mg), 65 mL of toluene, and a 20 weight percent tetraethylammonium hydroxide aqueous solution (11.4 g) are put in a 4-necked flask under an argon atmosphere and then, stirred at 85° C. for 6 hours. Subsequently, phenyl boronic acid (24.2 mg), tetrakis(triphenyl phosphine)palladium (0) (31.3 g), and a 20 weight percent tetraethylammonium hydroxide aqueous solution (11.4 g) are added thereto and then, stirred for 3 hours. Then, sodium N,N-diethyldithio carbamate hydrate (5.40 g) dissolved in 50 mL of ion exchange water is added thereto and then, stirred at 85° C. for 2 hours. An organic layer is separated from an aqueous layer and then, washed with water, a 3 weight percent acetic acid aqueous solution, and water. The organic layer is passed through column chromatography charged with silica gel/alumina, and the solvent is distilled and removed under a reduced pressure. The obtained liquid is added in a dropwise fashion to methanol, and a solid extracted therefrom is dissolved in toluene. Subsequently, this solution is dropped in a dropwise fashion to methanol, and the extracted solid is filtered and dried to obtain Polymer Compound P-4 (0.78 g). A number average molecular weight (Mn) and polydispersity (Mw/Mn) of Polymer Compound P-4 are measured with SEC. As a result, Mn and Mw/Mn of Polymer Compound P-4 are respectively 11,000 g/mol and 2.45.

Polymer Compound P-4 obtained in this way is expected to have the following structural unit based on an injection ratio of the monomers.

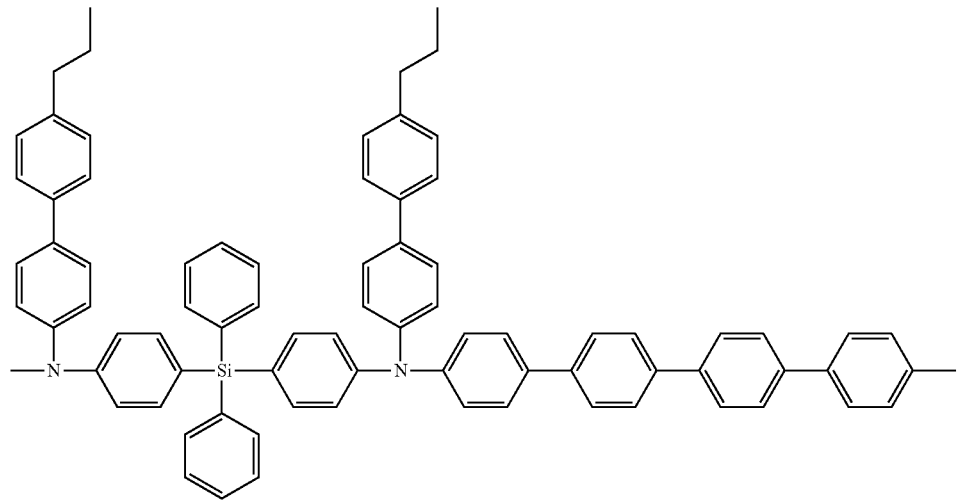

Polymer compound P-4

Example 5

Polymer Compound P-5 (0.78 g) is obtained according to the same method as Example 2 except that Compound C-1 according to Synthesis Example 3 is used instead of Compound B-1 according to Example 2. A number average molecular weight (Mn) and polydispersity (Mw/Mn) of Polymer Compound P-5 are measured with SEC. As a result, Mn and Mw/Mn of Polymer Compound P-5 are respectively 73,000 g/mol and 3.70.

Polymer Compound P-5 obtained in this way is expected to have the following structural unit based on an injection ratio of the monomers.

Polymer compound P-5

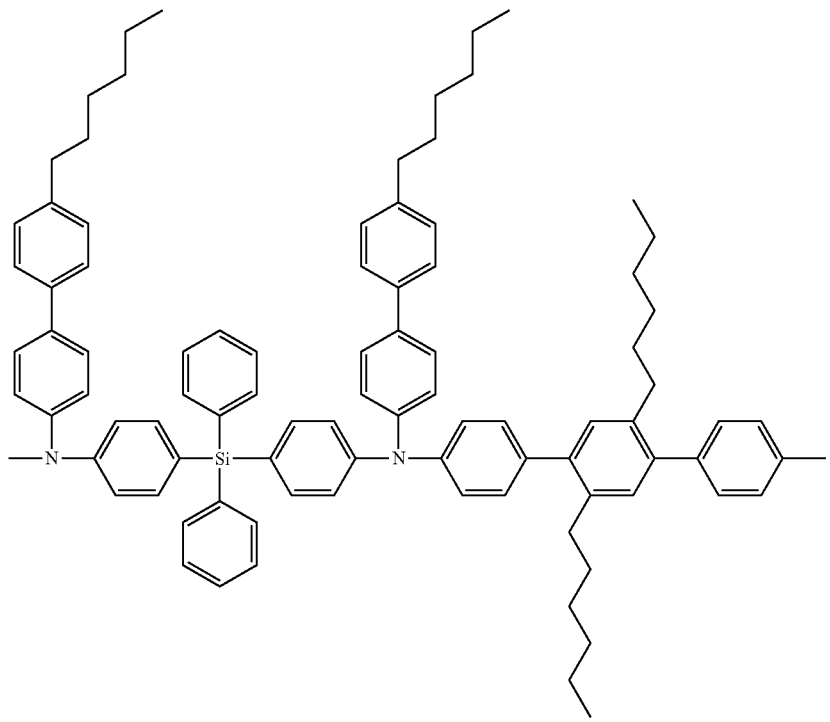

Example 6

Compound D-2 (2.06 g) according to Synthesis Example 4, 2,2'-(2,5-dihexyl-1,4-phenylene)bis(4,4,5,5-tetramethyl 1,3,2-dioxaborolane) (0.662 g), palladium acetate (3.7 mg), tris(2-methoxyphenyl)phosphine (34.6 mg), 45 mL of toluene, and a 20 weight percent tetraethylammonium hydroxide aqueous solution (8.44 g) are put in a 4-necked flask under an argon atmosphere and then, stirred at 85° C. for 6 hours. Subsequently, phenyl boronic acid (24.2 mg), tetrakis(triphenyl phosphine)palladium (0) (37.9 g), and a 20 weight percent tetraethylammonium hydroxide aqueous solution (8.44 g) are added thereto and then, stirred for 3 hours. Then, sodium N,N-diethyldithio carbamate 3hydrate (5.53 g) dissolved in 20 mL of ion exchange water is added thereto and then, stirred at 85° C. for 2 hours. An organic layer is separated from an aqueous layer and then, washed with water, a 3 weight percent acetic acid aqueous solution, and water. The organic layer is passed through column chromatography charged with silica gel/alumina, and the solvent is distilled and removed under a reduced pressure. The obtained liquid is added in a dropwise fashion to methanol, and a solid extracted therefrom is dissolved in toluene. Subsequently, this solution is dropped in a dropwise fashion to methanol, and the extracted solid is filtered and dried to obtain Polymer Compound P-6 (1.44 g). A number average molecular weight (Mn) and polydispersity (Mw/Mn) of Polymer Compound P-6 are measured with SEC. As a result, Mn and Mw/Mn of Polymer Compound P-4 are respectively 58,000 g/mol and 1.52.

Polymer Compound P-6 obtained in this way is expected to have the following structural unit based on an injection ratio of the monomers.

Polymer compound P-6

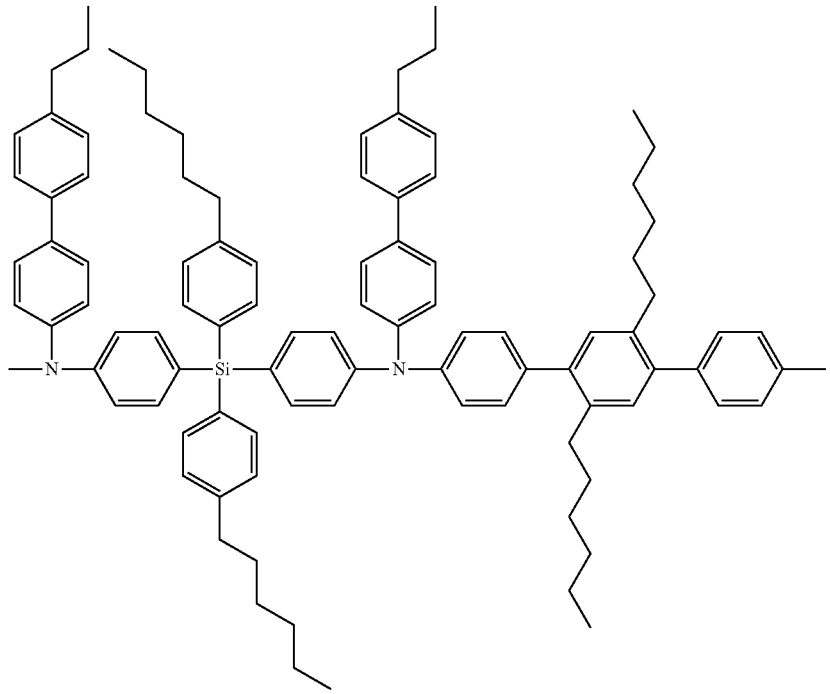

Example 7

Compound D-2 (1.67 g) according to Synthesis Example 4, Compound E-2 according to Synthesis Example 5 [2,2'-(2,5-dihexyl-[1,1':4',1''-terphenyl]4,4''-diyl)bis(4,4,5,5-tetramethyl-1,3,2-dioxaborolane)] (0.887 g), palladium acetate (3.1 mg), tris(2-methoxyphenyl)phosphine (28.8 mg), 50 mL of toluene, and a 20 weight percent tetraethylammonium hydroxide aqueous solution (7.61 g) are put in a 4-necked flask under an argon atmosphere and then, stirred at 85° C. for 6 hours. Subsequently, phenyl boronic acid (24.2 mg), tetrakis(triphenyl phosphine)palladium (0) (31.5 g), and a 20 weight percent tetraethylammonium hydroxide aqueous solution (7.03 g) are added thereto and then, stirred for 3 hours. Then, sodium N,N-diethyldithio carbamate 3hydrate (4.67 g) dissolved in 20 mL of ion exchange water is added thereto and then, stirred at 85° C. for 2 hours. An organic layer is separated from an aqueous layer and then, washed with water, a 3 weight percent acetic acid aqueous solution, and water. The organic layer is passed through column chromatography charged with silica gel/alumina, and the solvent is distilled and removed under a reduced pressure. The obtained liquid is added in a dropwise fashion to methanol, and a solid extracted therefrom is dissolved in toluene. Subsequently, this solution is dropped in a dropwise fashion to methanol, and the extracted solid is filtered and dried to obtain Polymer Compound P-7 (1.36 g). A number average molecular weight (Mn) and polydispersity (Mw/Mn) of Polymer Compound P-7 are measured with SEC. As a result, Mn and Mw/Mn of Polymer Compound P-4 are respectively 47,000 g/mol and 2.80.

Polymer Compound P-7 obtained in this way is expected to have the following structural unit based on an injection ratio of the monomers.

Polymer compound P-7

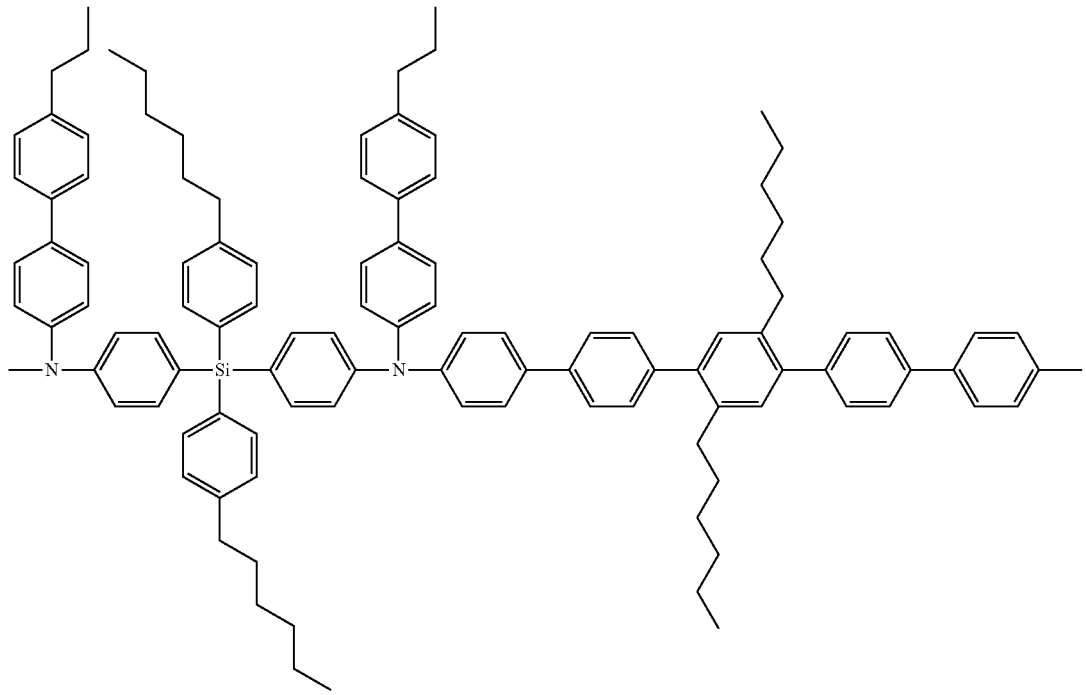

Example 8

As for a first electrode (an anode), a glass substrate adhered with indium tin oxide (ITO) patterned to have a film thickness of 150 nm is used. This ITO-adhered glass substrate is sequentially washed with a neutral detergent, deionized water, water, and isopropyl alcohol and then, treated with UV-ozone. Subsequently, on this ITO-adhered glass substrate, poly(3,4-ethylenedioxythiophene)/poly(4-styrenesulfonate) (PEDOT/PSS) (Sigma-Aldrich Co., Ltd.) is spin-coated and dried to have a dry film thickness of 30 nm. As a result, a hole injection layer having a thickness (the dry film thickness) of 30 nm is formed on the ITO-adhered glass substrate.

On this hole injection layer (HIL), a hole transport layer is formed by spin-coating a toluene solution of 1.0 weight percent of Polymer Compound P-1 according to Example 1 (a hole transporting material) to have a dry film thickness of 30 nm and heat-treating it at 230° C. for 60 minutes. As a result, the hole transport layer having a thickness (dry film thickness) of 30 nm is formed on the hole injection layer (HIL).

Figure 2:
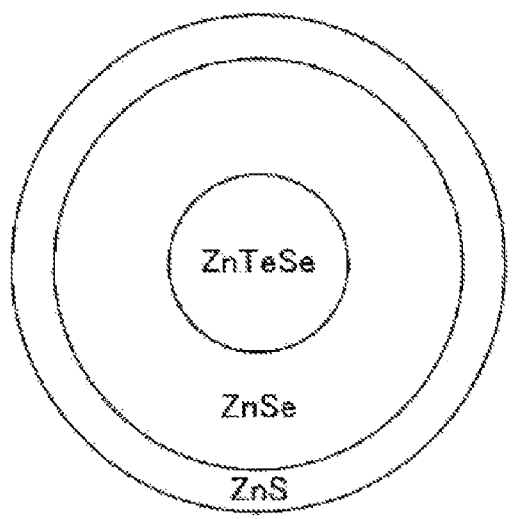
FIG. 2 is a schematic view showing the core/shell/shell quantum dot structure of Example 8.

Quantum dot dispersion is prepared by dispersing a blue quantum dot having the structure of ZnTeSe/ZnSe/ZnS (core/shell/shell as shown in FIG. 2; average diameter=about 10 nm) to be 1.0 weight percent in cyclohexane.

And, the hole transport layer (particularly, Polymer Compound P-1) is not dissolved in the cyclohexane. This quantum dot dispersion is spin-coated and dried to have a dry film thickness of 30 nm on the hole transport layer (HTL). As a result, a quantum dot light emitting layer having a thickness (dry film thickness) of 30 nm is formed on the hole transport layer (HTL). And, the quantum dot dispersion emits light having a central wavelength of 462 nm and FWHM (full width at half-maximum) of 30 nm, when irradiated by ultraviolet (UV).

This quantum dot light emitting layer is completely dried. On this quantum dot light emitting layer, lithium quinolate (Liq) and 1,3,5-tris(N-phenylbenzimidazol-2-yl)benzene (TPBI) (Sigma-Aldrich Co., Ltd.) as an electron transporting material are codeposited by using a vacuum deposition apparatus. As a result, an electron transport layer having a thickness of 36 nm is formed on the quantum dot light emitting layer.

On this electron transport layer, (8-quinolato)lithium (lithium quinolate) (Liq) is deposited by using the vacuum deposition apparatus. As a result, an electron injection layer having a thickness of 0.5 nm is formed on the electron transport layer.

On this electron injection layer, aluminum (Al) is deposited by using the vacuum deposition apparatus. As a result, a second electrode having a thickness of 100 nm (a cathode) is formed on the electron injection layer. Accordingly, a quantum dot electroluminescence device 1 is obtained.

Example 9

A quantum dot electroluminescence device 2 is manufactured according to the same method as Example 8 except that Polymer Compound P-2 according to Example 2 is used instead of Polymer Compound P-1.

Example 10

A quantum dot electroluminescence device 3 is manufactured according to the same method as Example 8 except that Polymer Compound P-3 according to Example 3 is used instead of Polymer Compound P-1.

Example 11

A quantum dot electroluminescence device 4 is manufactured according to the same method as Example 8 except that Polymer Compound P-4 according to Example 4 is used instead of Polymer Compound P-1.

Comparative Example 1

A comparative quantum dot electroluminescence device 1 is manufactured according to the same method as Example 8 except that poly[(9,9-dioctylfluorenyl-2,7-diyl)-co-(4,4'-(N-(4-sec-butylphenyl)diphenylamine)] (TFB) (Luminescence Technology Corp.) having the following structural unit is used instead of Polymer Compound P-1. And, a number average molecular weight (Mn) and polydispersity (Mw/Mn) of TFB are measured with SEC. As a result, Mn and Mw/Mn of TFB are respectively 359,000 g/mol and 3.4.

Chemical Formula 23

TFB

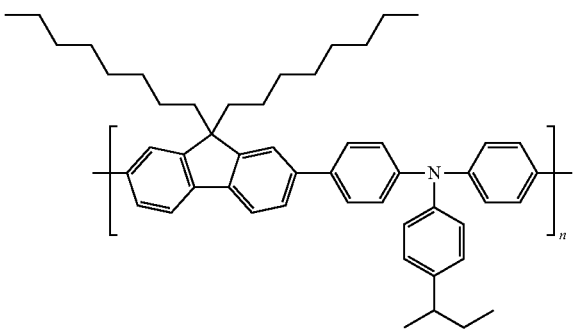

Evaluation of Quantum Dot Electroluminescence Device

The quantum dot electroluminescence devices 1 to 7 according to Examples 8 to 14 and the comparative quantum dot electroluminescence device 1 according to Comparative Example 1 are evaluated with respect to luminous efficiency.

When a voltage is applied to each quantum dot electroluminescence device by using a DC constant voltage power source (a source meter, Keyence Corp.), a current starts to flow therein at a constant voltage and the quantum dot electroluminescence devices emit light. A voltage at current density of 5 milliampere per square centimeter ($mA/cm^2$) is used as a driving voltage (Vop) volts (V). In addition, while luminance of each device is measured by using a luminance-measuring device (SR-3, Topcom), a current is slowly increased, and when the luminance becomes 100 nits (candela per square meter, $cd/m^2$), the current is maintained to be constant, and the devices are allowed to stand. Herein, a current value per unit area (current density) is calculated from an area of each device, and luminance ($cd/m^2$) is divided by the current density (ampere per square meter, $A/m^2$) to calculate current efficiency (candela per ampere, cd/A). The current efficiency indicates efficiency (conversion efficiency) converting a current into light emitting energy, and as the current efficiency is higher, a device exhibits higher performance.

In addition, external quantum efficiency (EQE) (%) at luminance of 100 nits is calculated from a spectral radiant luminance spectrum measured by a luminance-measuring device, assuming that Lambertian radiation is performed, and then, used to evaluate luminous efficiency.

The results are shown in Table 1.

TABLE

| | Polymer compound (hole transport material) | Mn (Mw/Mn) | Vop @5 $mA/cm^2$ (V) | Current efficiency (cd/A) | EQE % |
|---|---|---|---|---|---|
| Example 8 | P-1 | 106,000 (1.94) | 3.9 | 3.9 | 4.9 |
| Example 9 | P-2 | 121,000 (1.60) | 4.5 | 3.1 | 3.8 |
| Example 10 | P-3 | 89,000 (1.89) | 3.7 | 2.9 | 3.6 |
| Example 11 | P-4 | 11,000 (2.45) | 4.5 | 3.2 | 4.0 |
| Comparative Example 1 | TFB | 359,000 (3.4) | 4.6 | 2.6 | 3.2 |

EQE: SAIT Blue QD(OA), 100 nits

Referring to the results of Table 1, the quantum dot electroluminescence devices 1 to 7 according to Examples exhibit much higher performance (current efficiency, external quantum efficiency) at a low driving voltage than the comparative quantum dot electroluminescence device 1 using no arylamine polymer including silicon.

While this disclosure has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

| Description of Symbols | |
|---|---|
| 100: electroluminescence device (EL device) | |
| 110: substrate | 120: first electrode |
| 130: hole injection layer | 140: hole transport layer |
| 150: light emitting layer | 160: electron transport layer |
| 170: electron injection layer | 180: second electrode. |

What is claimed is:

1. An arylamine polymer including a repeat unit (A) represented by Chemical Formula (1):

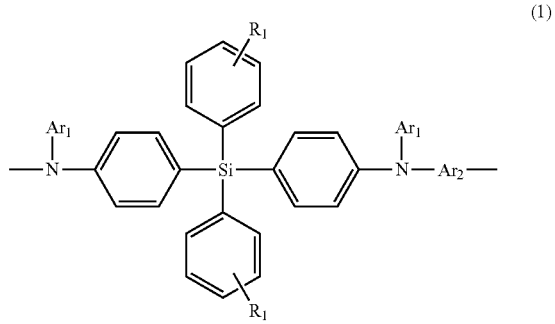

(1)

wherein, in Chemical Formula (1), $Ar_1$ is independently a C6 to C25 aromatic hydrocarbon group which is optionally substituted, or a C12 to C25 heterocyclic aromatic group which is optionally substituted;

$Ar_2$ is a C6 to C25 divalent aromatic hydrocarbon group which is optionally substituted, or a C12 to C25 divalent heterocyclic aromatic group which is optionally substituted; and R₁ is independently a hydrogen atom, a C1 to C12 linear, branched, or cyclic hydrocarbon group, or a C6 to C25 aromatic hydrocarbon group, each of which is optionally substituted.

2. The arylamine polymer of claim 1, wherein the repeat unit (A) is included in an amount of greater than equal to about 10 mole percent and less than or equal to about 100 mole percent, based on a total moles of repeat units of the polymer.

3. The arylamine polymer of claim 1, wherein at least one Ar₁ is of the following groups:

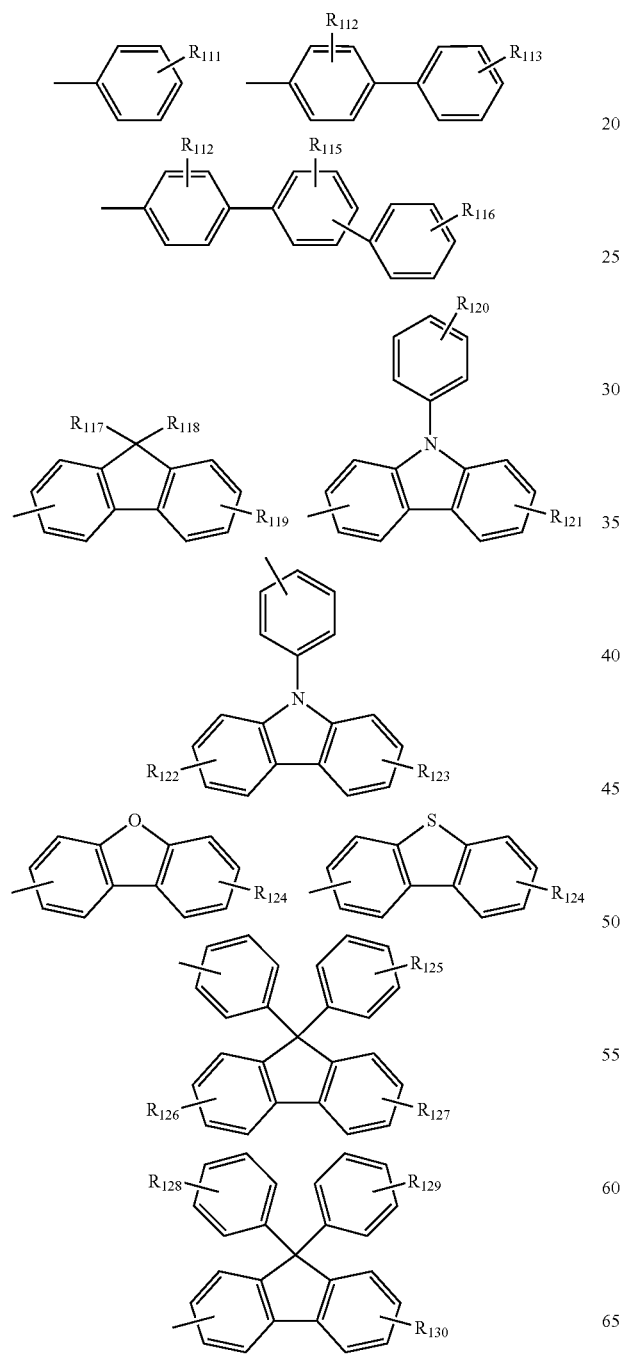

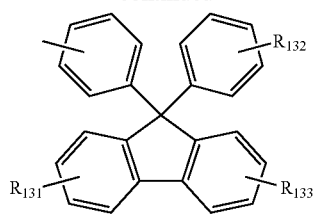

wherein, in the above chemical formulae, $R_{111}$ to $R_{133}$ are independently a hydrogen atom, or a C1 to C12 linear or branched alkyl group, or a C6 to C25 aromatic hydrocarbon group, each of which is optionally substituted.

4. The arylamine polymer of claim 1, wherein Are is a divalent group of the following groups:

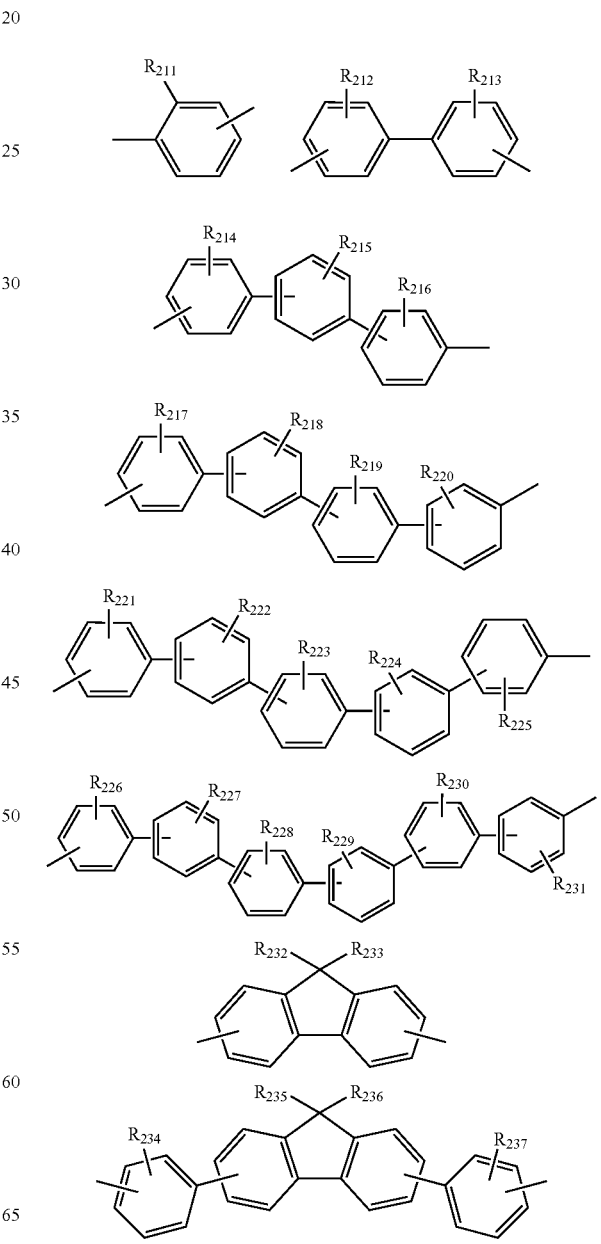

-continued

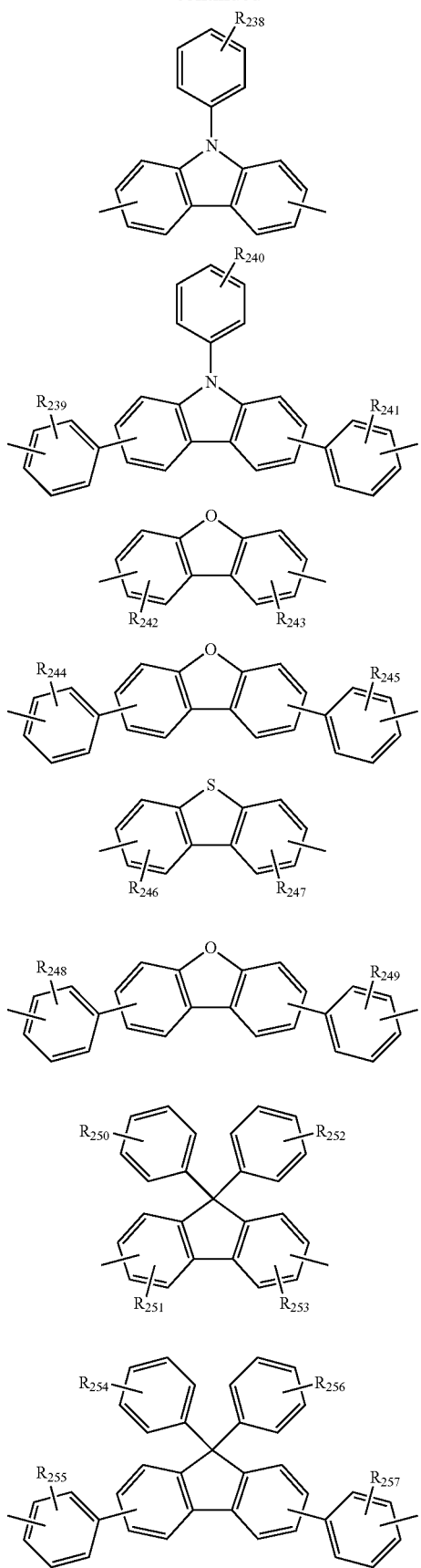

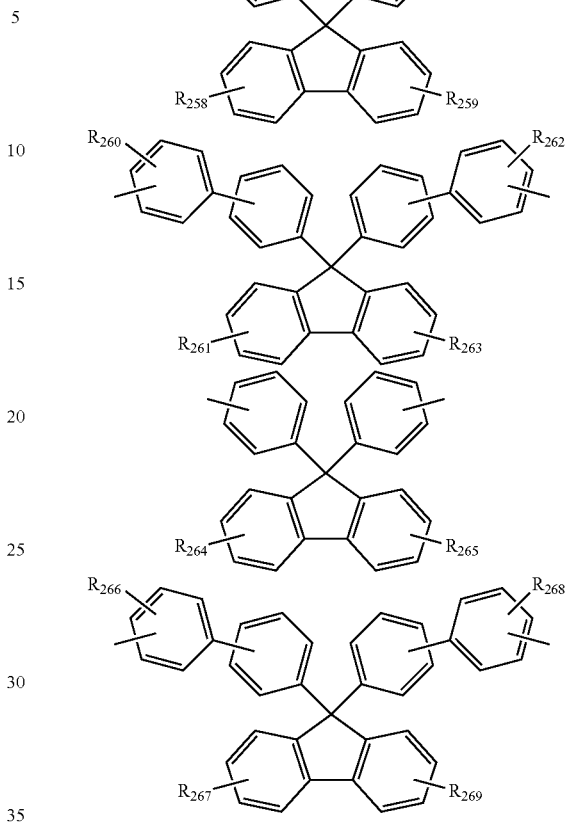

wherein, in the above chemical formulae, $R_{211}$ to $R_{269}$ are independently, a hydrogen atom, or a C1 to C12 linear or branched alkyl group, or a C6 to C25 aromatic hydrocarbon group, each of which is optionally substituted.

5. An electroluminescence device material comprising the arylamine polymer including silicon of claim 1.

6. An electroluminescence device comprising
a first electrode, a second electrode, and at least one organic film disposed between the first electrode and the second electrode,
wherein at least one layer of the organic film comprises the arylamine polymer of claim 1.

7. The electroluminescence device of claim 6, wherein the organic film comprising the arylamine polymer including silicon is a hole transport layer or a hole injection layer.

8. The electroluminescence device of claim 7, further comprising light emitting layer comprising a semiconductor nanoparticle or an organic metal complex.

9. The arylamine polymer of claim 1, wherein $Ar_1$ includes a substituent and the substituent is positioned at a ring carbon furthest from the chain nitrogen atom from which $Ar_1$ is linked to.

10. An electroluminescence device comprising
a first electrode, a second electrode, and at least one organic film disposed between the first electrode and the second electrode, wherein the organic film is a hole transport layer or a hole injection layer, and comprises the arylamine polymer of claim 1, and
a light emitting layer comprising a semiconductor nanoparticle or an organic metal complex.

11. The electroluminescence devise of claim 10, wherein at least one $Ar_1$ of the repeat unit (A) represented by Chemical Formula (1) is of the following groups:

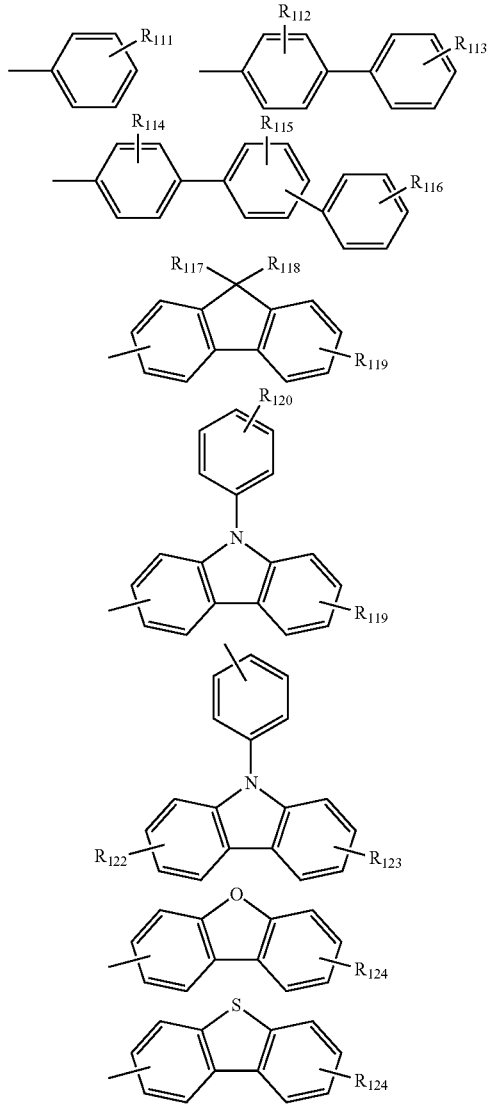

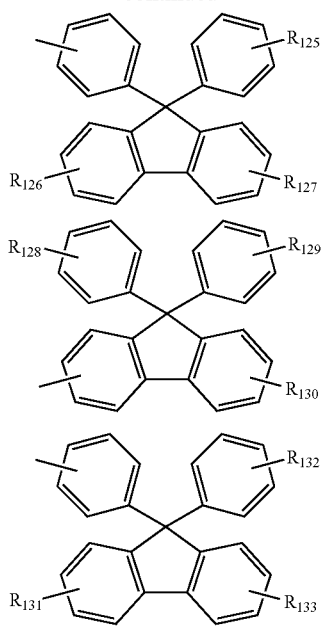

wherein, in the above chemical formulae, $R_{111}$ to $R_{133}$ are independently a hydrogen atom, or a C1 to C12 linear or branched alkyl group, or a C6 to C25 aromatic hydrocarbon group, each of which is optionally substituted.

12. The electroluminescence device of claim 10, wherein the substituent selected from $R_{111}$, $R_{113}$, $R_{116}$, $R_{119}$, $R_{120}$ or $R_{121}$, $R_{122}$ or $R_{123}$, $R_{124}$, or $R_{125}$ to $R_{133}$, is positioned at a ring carbon furthest from the chain nitrogen atom from which $Ar_1$ is linked to.

13. The electroluminescence device of claim 10 having an external quantum efficiency of 3.6% to 4.9% at luminance of 100 units.

14. The arylamine polymer of claim 1 having a weight average molecular weight from about 20,000 grams per mole to about 300,000 grams per mole, and a polydispersity of about 1.2 to about 3.5 as determined by size exclusion chromatography.

* * * * *